(12) United States Patent
Falangas

(10) Patent No.: US 8,380,473 B2
(45) Date of Patent: Feb. 19, 2013

(54) METHOD OF MODELING DYNAMIC CHARACTERISTICS OF A FLIGHT VEHICLE

(76) Inventor: Eric T. Falangas, Fountain Valley, CA (US)

( * ) Notice: Subject to any disclaimer, the term of this patent is extended or adjusted under 35 U.S.C. 154(b) by 537 days.

(21) Appl. No.: 12/592,651

(22) Filed: Dec. 1, 2009

(65) Prior Publication Data

US 2010/0318336 A1   Dec. 16, 2010

Related U.S. Application Data

(60) Provisional application No. 61/268,434, filed on Jun. 13, 2009.

(51) Int. Cl.
*G06G 7/48* (2006.01)

(52) U.S. Cl. ........ 703/8; 703/1; 701/4; 702/57; 702/105

(58) Field of Classification Search ............. 703/1, 6–8, 703/22; 702/57, 105; 701/3–10; 434/30
See application file for complete search history.

(56) References Cited

U.S. PATENT DOCUMENTS

| | | | | |
|---|---|---|---|---|
| 4,849,900 A * | 7/1989 | Blight et al. | ...................... | 701/7 |
| 6,568,634 B2 * | 5/2003 | Smith | ............................. | 244/72 |
| 6,826,493 B1 * | 11/2004 | Mangalam | ...................... | 702/45 |
| 6,882,964 B2 * | 4/2005 | Bayard et al. | ................. | 702/191 |
| 7,080,565 B2 * | 7/2006 | Delair et al. | ............. | 73/862.325 |
| 7,165,465 B2 * | 1/2007 | De Lair et al. | ............. | 73/862.326 |
| 7,342,763 B2 * | 3/2008 | Mladenik et al. | ............ | 361/119 |
| 2005/0040280 A1 * | 2/2005 | Hua | ................................ | 244/3.1 |
| 2007/0260424 A1 * | 11/2007 | Brown et al. | .................. | 702/182 |
| 2009/0171634 A1 * | 7/2009 | Bensch et al. | ..................... | 703/2 |
| 2009/0306866 A1 * | 12/2009 | Malikopoulos | .................. | 701/59 |
| 2010/0268353 A1 * | 10/2010 | Crisalle et al. | ................... | 700/29 |
| 2010/0305912 A1 * | 12/2010 | Viassolo et al. | ................... | 703/2 |

OTHER PUBLICATIONS

Abdullah et al, Model Reference Control of LPV Systems, Journal of the Franklin Institute, vol. 346, No. 9, Nov. 2009, pp. 854-871.*

Dharmayanda et al, Motion Stability of Small Scale Helicopter Using State Feedback, IEEE International Conference on Control, Automation, and Systems, 2007, pp. 1439-1444.*

Belkharraz et al, Simple Adaptive Control for Aircraft Control Surface Failures, IEEE Transactions on Aerospace and Electronic Systems, vol. 43, No. 2, 2007, pp. 600-611.*

Natesan et al, Design of Flight Controllers Based on Simplified LPV Model of a UAV, 45th IEEE Conference on Decision and Control, 2006, pp. 37-42.*

Singh et al, Ultimate Boundedness Control of Uncertain Systems with Application to Roll Coupled Aircraft Maneuver, Proceedings of the $28^{th}$ IEEE Conference on Decision and Control, 1989, pp. 1708-1713.*

Stiharu-Alexe et al, On the Robust Control of Aeroelastic Vehicles, IEEE American Control Conference, 1994, pp. 696-700.*

Lyshevski et al, High-Performance Direct-Drive Flight Actuators: Advanced Technology Demonstration, Proceedings of the 1999 IEEE International Conference on Control Applications, 1999, pp. 1229-1234.*

* cited by examiner

*Primary Examiner* — Russell Frejd
(74) *Attorney, Agent, or Firm* — Lazaris IP

(57) ABSTRACT

The present invention models dynamic behavior of flight vehicles for simulation, analysis, and design. The present invention allows a user to define the complexity of a flight vehicle model, and such models may be simple rigid body models, models of medium complexity, or very complex models including high order dynamics comprising hundreds of structural flexibility modes and variables related to aero-elasticity, fuel sloshing, various types of effectors, tail-wags-dog dynamics, complex actuator models, load-torque feedback, wind gusts, and other parameters impacting flight vehicles. The present invention accommodates and analyzes multiple vehicle and actuator concepts and configurations as defined in flight vehicle input data, which specifies flight vehicle parameters at a steady-state condition for modeling flight vehicle response to dynamic forces and flight control commands with respect to steady state operation.

58 Claims, 3 Drawing Sheets

METHOD OF MODELING DYNAMIC CHARACTERISTICS OF A FLIGHT VEHICLE

CROSS-REFERENCE TO RELATED APPLICATIONS

This application claims priority to a provisional application having Ser. No. 61/268,434, filed Jun. 13, 2009, the contents of which are hereby incorporated by reference in their entirety.

BACKGROUND OF THE INVENTION

The present invention generally relates to a method of modeling dynamic characteristics of flight vehicles. Specifically, the present invention relates to a method of compiling input data defining characteristics of a flight vehicle and generating system output data for performing simulation, analysis, and design on the flight vehicle control system.

REFERENCE TO COMPUTER PROGRAM LISTING APPENDIX

Two compact discs having stored thereon a computer program listing have been submitted in the present application. The compact discs are submitted in duplicate and therefore identical. Each includes one file titled SAMPLE_INPUT_DATA_FILE.txt, created Sep. 28, 2012, and having a size of 30 KB. The entire contents are hereby incorporated by reference.

Existing methods of modeling high order flight vehicle dynamics and generating an output file for use in simulation, analysis, and design of flight vehicle controls are complicated and time consuming. The performance quality of flight vehicles, such as launch vehicles, re-entry vehicles, and high performance aircraft, is generally studied in two distinct, though related, phases. The first one deals with orbital mechanics, vehicle guidance, and the shaping of point mass trajectories assuming that the vehicle can be perfectly steered along the desired path. This analysis is usually referred to as "long period dynamics." The second study deals with small variations or perturbations of the vehicle from its nominal trajectory. The perturbation dynamics have a shorter period and they are also referred to as "short period dynamics." Flight vehicles are modeled as linear state-space representations used for analyzing the flight control system stability and performance with respect to guidance commands, wind gust disturbances, failures, etc.

Although vehicle parameters such as mass properties, aero data, trajectory, and others are constantly changing throughout a mission, flight control system (FCS) gains and filters are traditionally designed at fixed, mission critical flight conditions, called "time slices." Critical conditions for rocket vehicles are at high dynamic pressures, lift-off, maximum slosh, before and after staging, high angles of attack ($\alpha$), etc. The flight control system gains are interpolated or phased-in between the time slices using "gain scheduling." For an aircraft one estimates the range of flight envelope in terms of alphas versus Mach number, and design flight control system gains at as many alpha and Mach number combinations as necessary to cover the flight envelope. Lookup tables of gains versus alphas and Mach numbers are coded in modeling software and the gains are interpolated at intermediate values.

There is a need for a modeling tool that can easily create vehicle state-space models for control design and analysis directly from vehicle parameters at different flight conditions, for flight vehicle models ranging from simple rigid-body models for preliminary flight control system design to more complex ones that include high order resonances used for detailed design, stability analysis and performance evaluation in presence of disturbances. The present invention is therefore motivated at least in part by the need for a comprehensive flight vehicle modeling tool that aggregates all input data and is easy and convenient to use and yet versatile enough to apply to different types of flight vehicles and varying parameters and complexity of modeling.

BRIEF SUMMARY OF THE INVENTION

The present invention is a utility software product used to create linear dynamic models of flight vehicles that can be used for simulation purposes and also for control analysis and design. Flight vehicles include but are not limited to aircraft, gliders, spacecraft, space shuttles, space stations, launch vehicles, rocket planes, missiles, and any other vehicles capable of flight. The present invention allows a user to define the complexity of the models created, and such models may be simple rigid body models for preliminary analysis, models of medium complexity, or very complex models including high order dynamics that include hundreds of structural flexibility modes and variables related to aero-elasticity, fuel sloshing, various types of effectors, tail-wags-dog dynamics, complex actuator models, load-torque feedback, wind gusts, etc. Other aspects of flight vehicles that can be modeled with the present invention include any number of thrust vector control (TVC) engines, a number of throttling engines, a number of RCS jets, a number of control surfaces, control moment gyros (CMG), or reaction wheels, etc.

The present invention is not tailored to any specific vehicle application, but can accommodate and analyze multiple vehicle concepts and configurations. Vehicle configuration is defined in the input data, which specifies flight vehicle parameters at a steady-state condition for modeling variables of flight vehicle response to dynamic forces during steady-state operation of the flight vehicle, and which may include, but is not limited to data relating to mass properties, aerodynamic data, trajectory data, engine data, slosh, control surface data, hinge moment coefficients, aero-elastic coefficients, CMG, reaction wheel data, sensor types, and other variables.

Input data is compiled and applied to multiple utility subprograms that perform functions such as flight vehicle and actuator modeling, designing mixing logic for combining various types of effectors, reading modal data files, selecting important bending modes and resealing the modal data, modifying scaling and reducing state-space systems, and combining subsystems together. The various utility subprograms are selected from menus on a graphical user interface (GUI) using windows and dialog boxes to accept data and allow a user to control performance of the present invention.

The present invention utilizes different types of data files, including input data files, modal data files, and output system files. An input data file consists of sets of data, each set of data designated to provide data specific to a utility subprogram. An input data file has a specific extension, and it is dedicated to a specific project. Each input data file may contain several sets of flight vehicle or other utility program data. For example, the input data file may include flight vehicle data for creating a vehicle system, actuator data for creating actuator systems, system modification data, and system interconnection data, all designated for a specific vehicle modeling project. A user of the present invention does not need to create the input data files from scratch, but the present invention includes GUI utilities for entering the input data for a vehicle, actuator, etc. The vehicle parameters are saved by the program in the input data file.

Outputs are linear state-space systems and matrices. They are saved in system files that also have a specific filename extension. The present invention also includes utilities that convert the output systems or matrices to file formats for third party programs such as Matlab® so that they can easily be imported into such a program for control analysis and simulations.

The present invention includes additional GUI utilities for maintaining the input and output data files and for making them more presentable to the user. Each system contained with an input or output data file is defined by a title, a short functional description, and also definitions of its inputs, states, and outputs. There are graphic utilities for viewing such system files via menus and dialog displays. After an output data file is generated with the present invention, state-space matrices created by the system data therein can be graphically displayed with color-coded elements. User-defined comments may be displayed on the side of the system matrices together with the definitions of the system inputs, states, and outputs.

The present invention also includes GUI utilities for viewing, editing, and executing input data files. A user may access menus and dialogs for selecting data sets within an input data file, and is capable of modifying data sets, copying data sets to another filename, introducing user defined comments and notes, and executing data sets using the appropriate utility subprogram. Accordingly, a utility subprogram can either be selected to run from the main menu or from an input data file GUI utility.

The present invention also has a batch processing option, where several sets of input data within a single input data file can be processed together instead of executing each program individually. The program requires a batch input, which is a set of commands, to be included in the input data file. Each command line within the batch calls a utility subprogram with the title of a data set containing the appropriate input data. Batch processing greatly reduces the time required to create a vehicle model since many times one needs to modify the input data and recreate the model. There is also a utility for creating batch data.

In addition to dynamic modeling the present invention also performs static stability and static performance analysis. There are utilities which evaluate the vehicle performance along a desired trajectory using mass properties, aerodynamic coefficients, engine data, etc. They evaluate trimability, static stability, time to double amplitude, and other lateral performance parameters which give a good indication of a vehicle concept's flyability. The static performance utilities are great for quick initial evaluation of new vehicle concepts.

A typical vehicle modeling, design, and flight control analysis procedure with the present invention begins with a simple rigid-body vehicle model. The flight vehicle modeling program of the present invention is used to obtain a linear state-space model from the vehicle input data. The state-space model is saved in a system file. A mixing logic program may be used to create a gain matrix that converts roll, pitch, and yaw demands to engine or surface deflections. The mixing logic matrix may be combined with the simple vehicle model to create the design plant model in the systems file. The present invention may also be used to combine the vehicle system with the mixing logic matrix connected at the vehicle input. If necessary, these may also be decoupled into pitch and lateral subsystems for use separately to design preliminary control modes, and the present invention may also be used to extract the pitch and lateral subsystems from bigger systems.

The present invention may also be used to create an actuator state-space model using one of the actuator modeling options using a set of actuator parameters. Sensor models may also be created from transfer functions. The flight vehicle model may be combined with the actuator and sensor models together to create a bigger plant model. If the controller is in the z-domain, the present invention may transform the plant model using a z-transform option.

The plant model may be combined with the controller systems together in open-loop and closed-loop forms using a systems combination option. The open-loop and closed-loop models are used to analyze the overall system stability and performance in the frequency and time domain. If the stability and performance requirements are not satisfied, the flight control system gains may be modified, and lead-lag and notch filters may be added, and the analysis repeated.

The analyst may gradually increase the complexity of the flight vehicle models by adding parameters such as tail-wags-dog, slosh, bending, detailed actuator models, load torques and other dynamic effects to a satisfactory level of complexity.

The present invention therefore addresses the needs of the flight control analyst, who can easily transform the trajectory, aero, and mass properties data into linear state-space models for a quick evaluation of system performance at fixed flight conditions, all within one modeling tool. The program can be used to analyze various flight vehicles such as launch vehicles, rocket-planes, reentry vehicles, space stations, satellites, and high performance aircraft that use rocket engines, reaction jets, differential throttling, control moment gyros (CMG), reaction wheels (RW), and control surfaces. A model can easily be modified to a different configuration by changing the input data. The input data comprises trajectory data, aerodynamic data, mass properties, engine parameters, reaction control thrusters, orientation angles, control surfaces, CMG, RW, wind gust, locations of sensors and effectors, slosh parameters, bending mode frequencies, aero-elastic coefficients, mode shapes, and various types of actuator models using actuator parameters. The analyst may also gradually add more details and increase complexity in the vehicle model. Starting with a simple rigid body model that can be used for an initial evaluation of a new flight vehicle concept, the model may evolve using the modeling tool of the present invention into a very complex one as the configuration design matures by including more details such as fuel sloshing, bending, tail-wags-dog (TWD), load-torque feedback, high order actuator models, control surface hinge moments, thrust-vector-control (TVC), aero-surface mixing logic, and others. The present invention also includes options for creating actuator models, selecting the dominant flexible modes from modal data files, and generating mixing logic matrices that combines engine thrust vectored control (TVC), reaction jets (RCS), and control surfaces.

The present invention reads the vehicle and actuator data from the input data file and creates state-space models of the vehicle and actuator which are saved in the system file. There are other utility programs which also read information from the input file and save systems or gain matrices in the system file. The output state-space representation is commonly used for control system analysis. In fact, linear state-space plant models are the standard input to most robust control design and analysis tools such as LQG, H-infinity, etc. The output state-space vehicle models include pitch and lateral dynamics coupled together but the present invention provides additional utilities that decouple the systems, modify them, or extract a subsystem of selected inputs, states, and outputs from a bigger system. There are also situations where additional outputs are needed in the state-space model. For example, outputs that may be needed to evaluate vehicle performance in control synthesis or simulation models, such as outputs coming from states, state derivatives, or output derivatives. The present invention includes a system modification utility that performs such operations. System files use a standard format which includes the system title, followed by some comment lines that describe the system, followed by the matrices (A, B, C, D), and the definitions of the state variable inputs, states, and outputs at the bottom of each system, below the matrices. Utility options are also available to convert the state-space systems a format for Matlab® and also from Matlab® files.

The present invention therefore includes, in one embodiment, a method of modeling dynamic characteristics of a flight vehicle, comprising collecting input data specifying flight vehicle parameters at a steady-state condition for modeling variables of flight vehicle response to dynamic forces during steady-state operation of the flight vehicle, converting the input data into state-space systems data for use by at least one utility program module to create a state-space system modeling one or more components of flight vehicle activity, the at least one utility program module generating a systems data output file comprising at least one matrix mapping the input data to the state-space systems data, and generating an output file for simulating flight vehicle design and performance based on at least one matrix mapping the input data to the state-space systems data.

In another embodiment, the present invention includes a method of modeling dynamic characteristics of a flight vehicle, comprising compiling an input data file from input data defining a flight vehicle, executing the input data file to convert the input data defining a flight vehicle into a state-space system file comprising data defining at least one system, extracting the data defining at least one system from the state-space system file, and exporting the data defining the at least one system to a file format for simulating performance of the flight vehicle.

In another embodiment, the present invention includes a method of batch modeling dynamic characteristics of a flight vehicle, comprising compiling a batch input data file from multiple sets of batch input data defining flight vehicle parameters at a steady-state condition and defining a set of commands for modeling flight vehicle characteristics, calling a specific utility program module defined in the batch input data file within a title of the set of commands for the specific utility program module included within input data appropriate for the specific utility program module to convert the input data defining flight vehicle parameters at a steady-state condition into a state-space system file comprising data defining at least one system, extracting the data defining at least one system from the state-space system file, and exporting the data defining the at least one system to a file format for simulating performance of the flight vehicle.

In still another embodiment, the present invention includes a computer program product, comprising a computer usable medium having a computer readable program code embodied therein, the computer readable program code adapted to be executed to implement a method for modeling dynamic characteristics of a flight vehicle, the method comprising providing a system, wherein the system comprises distinct software modules each embodied in a computer hardware environment and comprising at least a data collection module, a data conversion module having a plurality of sub-modules each analyzing data relating to specific parameters defining flight vehicle movement, a data processing module, and an output file generation module, and compiling an input data file from input data defining a flight vehicle, executing the input data file to convert the input data defining a flight vehicle into a state-space system file comprising data defining at least one system, extracting the data defining at least one system from the state-space system file, and exporting the data defining the at least one system to a file format for simulating performance of the flight vehicle.

In yet another embodiment, the present invention includes a system for modeling dynamic characteristics of a flight vehicle, comprising a computer readable program, embodied on at least one module in a computer hardware environment, configured to compile an input data file from input data defining a flight vehicle, a computer readable program, embodied on at least one module in a computer hardware environment, configured to execute the input data file to convert the input data defining a flight vehicle into a state-space system file comprising data defining at least one system, a computer readable program, embodied on at least one module in a computer hardware environment, configured to extract the data defining at least one system from the state-space system file, and a computer readable program, embodied on at least one module in a computer hardware environment, configured to export the data defining the at least one system to a file format for simulating performance of the flight vehicle.

Other features and advantages of the present invention will become more apparent from the following description of the embodiments, taken together with the accompanying drawings, which illustrate, by way of example, the principles of the invention.

DETAILED DESCRIPTION OF THE INVENTION

Figure 1:
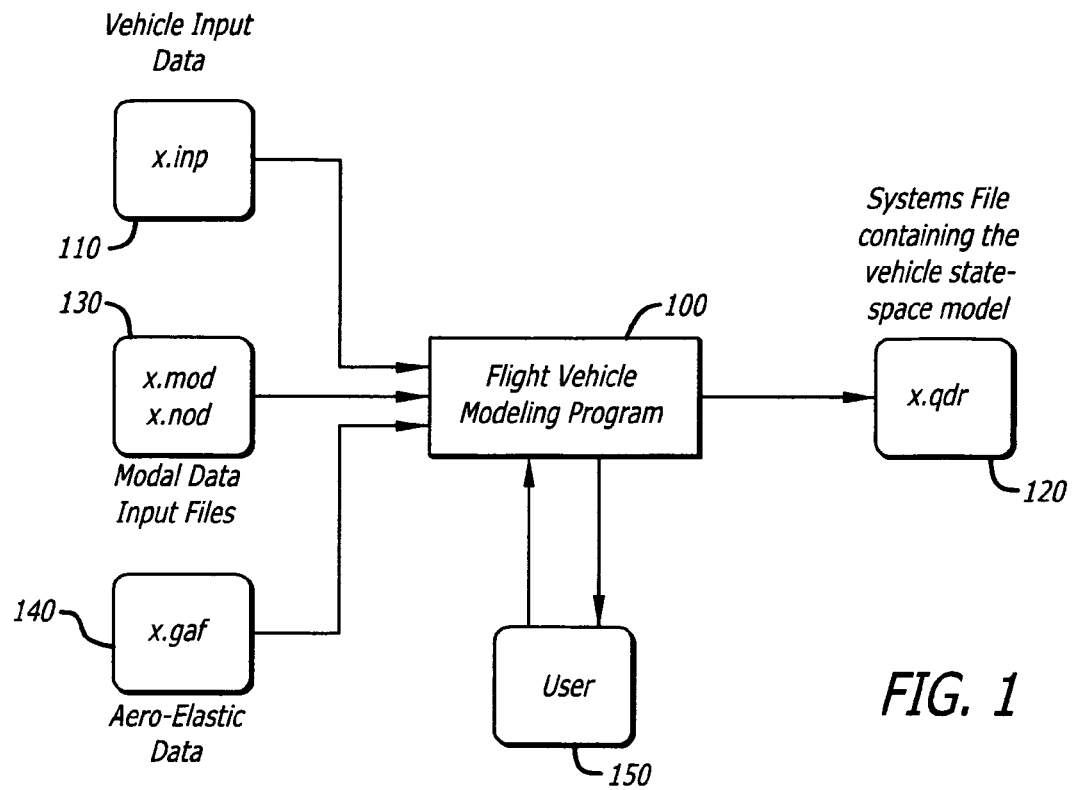
FIG. 1 is block diagram of inputs and outputs of a flight vehicle modeling program according to the present invention.

In the following description of the present invention reference is made to the accompanying drawings which form a part thereof, and in which is shown, by way of illustration, exemplary embodiments illustrating the principles of the present invention and how it may be practiced. It is to be understood that other embodiments may be utilized to practice the present invention and structural and functional changes may be made thereto without departing from the scope of the present invention.

Introduction

The present invention is a collection of flight vehicle modeling and analysis programs and other related utilities, used to create complex state-space models of flight vehicles for linear stability and performance analysis. The dynamic models may vary, from simple rigid body to very complex models that may include high order dynamics, such as actuators, tail-wag-dog, slosh and flexibility with hundreds of structural modes. The program is interactive and uses a graphical user interface (GUI) with windows and menus to interface with a user-analyst. The present invention, also referred to herein as the Flixan program package, the Flixan program, or simply Flixan, includes and performs the linearized equations of motion applicable to flight vehicles such as airplanes, gliders, launch vehicles, rockets, missiles, spacecraft, and other such vehicles capable of motion in air, space, or the atmosphere, and creates state-space systems at fixed conditions. The level of the complexity of the model is adjustable and customizable according to the preferences and needs of the user.

Among the many Flixan utility programs is an actuator modeling program that performs various hydraulic and electro-mechanical actuator models for engine thrust vector control (TVC) and for control surface slewing. The Flixan program package also includes a TVC/throttle control/aero-surfaces mixing logic program that creates an effector mixing logic matrix based on the engine parameters and the control surfaces' aero coefficients. When this matrix is included at the input of the flight vehicle model it decouples the fully-coupled vehicle dynamics by reducing the interaction in some rotational directions, mainly in roll, pitch, and yaw. Some translational directions may also be included in the mixing logic, such as motion along x or z, if the vehicle has sufficient control effectors to decouple motion along these translational directions. The flight vehicle model often needs to be combined together with actuator models, the mixing logic matrix, and the flight control system for control analysis. The Flixan package includes additional utility programs to combine state-space systems and matrices together, create state systems from transfer function interconnections, and to modify or extract subsystems from other systems. Still other utility programs perform other functions such as z-transform analysis of continuous systems to discrete state-difference systems sampled at some sampling rate (dT), managing data files, creating control design models for LQR or H-infinity, and transferring systems or matrices to third party programs such as Matlab®.

The present invention therefore provides a suite of vehicle modeling modules, all of which are selectable from a system of menu in the Flixan program's GUI. The present invention includes a flight vehicle modeling program 100 that reads the vehicle parameters, combines it with other flight vehicle data such as the modal data defining structural flexibility modes, and generates the flight vehicle state-space system data. Two main types of files are contemplated for the flight vehicle modeling program 100: input data files 110 that have a filename extension (.inp), and system files 120 with a filename extension (.qdr). FIG. 1 is a block depiction of the flight vehicle modeling program 100 inputs and outputs, showing types of input data files 110 and the output system file 120.

Referring to FIG. 1, for every vehicle or flight condition analysis a pair of files, an input data file 110 and a system file 120 are created specifically for that project. The input data file 110 includes sets of data or instructions for the Flixan utility programs. Each input data file 110 may contain many sets of data for the various utility programs. On the top of each data set a label identifies the utility program for which the data belongs to and that will be processed by this utility program. Below the label a short title defines the data. The same title is also used to define the system which is created by that data after being processed by the corresponding utility program. Below the title there may be some optional comments or user notes describing in more detail the purpose, conditions, intention, or any other details a user 150 may want to add for documentation purposes. There are interactive utilities within most Flixan programs that guide the user 150 in the preparation of the input data sets.

System files 120 include quadruple systems defined by state-space matrices (a, b, c, d), control design state-space models, or individual matrices. They are created by various programs in the Flixan program package. A system file 120 may include many systems, such as a simple rigid-body vehicle and a complex high order vehicle created by the flight vehicle modeling program 100. It may also include several actuator models for each aero-surface or engine TVC. The system file 120 may also have flight control or sensor systems implemented in terms of transfer-function combinations using the transfer-functions combination program. The system file 120 may also include systems derived by combining smaller subsystems using the systems combination utility program. There may also be discrete systems derived from continuous systems by using the z-transformation utility. The system file 120 may also include individual matrices such as gains or TVC matrices. The mixing logic program 300, for example, creates mixing logic matrices that translate the flight control, roll, pitch, and yaw demands, into individual aero-surface and TVC deflections. The Flixan program package further includes utilities used to create, process, edit, delete, view, or copy data sets containing input data for various Flixan programs.

Input and Output Files

As noted above, the input data files 110 have an extension (.inp) and include flight vehicle data, actuator, transfer functions, system interconnections, system modification data, etc. The flight vehicle modeling program 100 processes the input data and creates a system or a matrix. The first line of each set of input data in an input data file 110 identifies what type of data follows, such as for example FLIGHT VEHICLE INPUT DATA, or INTERCONNECTION OF SYSTEMS, or ACTUATOR INPUT DATA, or MIXING LOGIC, etc. The second line is a unique title for the data. The same title is also used to identify the system or the matrix which is created by the program and it is saved in a separate system file 120. The lines below the title, starting with an exclamation mark (!), are comment lines which are inserted there by the user 150, either directly by editing the input data file 110, or via other utility programs. Such comment lines assist the user 150 in formulating a modeling project. The comment lines appear in a dialog display where they can be modified, and they may also be transferred to the state-space model in the system file 120. A sample input data file 110 is shown below.

The input data file 110 includes vehicle parameters at a steady-state, or trimmed, condition. The input data file 110 also contains input data such as mass properties, trajectory, aerodynamic derivatives, engine data, control surface data, slosh parameters, various sensors, wind-gust, and flexibility data. An input data file 110 may include more than one set of flight vehicle data. For example, the input data file 110 may include a rigid-body set of flight vehicle data and a flexible vehicle set of flight vehicle data, and it may also include a number of structural flexibility modes, actuator data, and interconnection info.

Referring to the above sample input data file 110, the line below the vehicle title and the comment lines is the flags line. There are four flags which turn on different modeling options. The first flag is for resolving body rates, and can be set to either "Body Axes" (default) or "Stability Axes." The second flag determines the attitude output, can be set to either "Attitude=Euler Angles" (default) or "Attitude=Rate Integral." The third flag relates to aero-elastic data, and may be set to either "Without GAFD" (default) or "Include GAFD" when there is a GAFD data file available. The fourth flag relates to turn-coordination logic. If the vehicle flight software includes turn-coordination logic for an airplane, and the user 150 prefers the turn-coordination logic to be included in the plant model instead (in order to simplify the control design so that one does not have to carry it the controller), the flag is set to "With Turn Coordination." Otherwise, if the user 150 does not want to include turn-coordination, the flag is set to the default state.

Within the input data file 110, the first group of flight vehicle data below the flags relates to parameters such as mass properties, Inertias, CG, trajectory parameters, alpha, beta, attitude, altitude, nominal rates, accelerations, wind-gust disturbance, aero parameters, aero derivatives, etc. Other types of flight vehicle data in the input data file 110 includes the control surfaces information, such as trim position, max deflection, hinge line orientation, surface mass properties, moment arm, surface chord, hinge line location, hinge moment coefficients, aero-force and moment increments due to deflection, etc. The first line before the control surface data specifies the number of surfaces and also the tail-wags-dog (TWD) flag, either "Include TWD" or "No TWD" (default). Engine data is also included, comprising the nominal engine thrust and the maximum thrust (if the engine is throttable). If the engine is not throttable, (variable thrust), the maximum thrust is set equal to the nominal thrust. The engine data also includes a label that defines whether the engine is "Gimbaling," "Throttling," or both, since one may have a situation where some engines are gimbaling and some are throttling, or both. Other engine parameters include mounting angles, the maximum pitch and yaw deflections (if gimbaling, otherwise they are assumed to be zero), the engine mass properties for computing the TWD force, and the engine gimbal location in vehicle coordinates. A short label that identifies each engine or RCS thruster may also be included.

Among sensor data in the flight vehicle input data file 110, there are three types of sensors: gyros, accelerometers, and vane sensors. Each gyro is specified to measure either in roll, pitch, or yaw rotations. Although referred to as gyros, these sensors can be defined to measure either: angular position (rad), rate (rad/sec), or acceleration (rad/sec$^2$). Similarly, each accelerometer can be specified to measure along the vehicle x, y, or z axes. Although they are referred to as accelerometers, they can be defined to measure either: linear position (ft), velocity (ft/sec), or translational acceleration (ft/sec$^2$). Accelerometer measurements include rigid-body plus flex motion, and can also be configured to measure only the flex motion. One must also specify the location of the accelerometer in vehicle coordinates. The vane sensors measure the angles of attack and sideslip, and are normally located in front of the flight vehicle. As with accelerometers, one must also specify the vane location in vehicle coordinates.

Also defined in the flight vehicle data set, are the propellant sloshing parameters. When sloshing parameters are included, the Flixan program requires the slosh mass (slugs), the sloshing frequency in 1 g in (rad/sec), the damping coefficient, and the un-deflected (x, y, z) location of the slosh mass in vehicle coordinates. If there is no sloshing, the number of slosh masses is set to zero.

The flight vehicle data set may also include modal data which defines flex information. If a model is to be a rigid-body model the "Number of Bending Modes: 0" must be set, otherwise, the number of flex modes must be entered. If the number of bending modes is greater than zero, then the flight vehicle data set will also include the title of the selected modal data that will be combined with the rigid vehicle data. Modal data and flex modeling are discussed in full herein.

The selected modes are another set of flight vehicle data that should also be saved in the same input data file 110 together the vehicle rigid-body data. Note that in the present invention, when the term "input data file" is used, the flight vehicle data comprising the input data file 110 includes all flight vehicle data to be modeled: rigid-body vehicle data, modal data, etc. Modal data is collected using a separate module of the Flixan program package known as the mode selection program. The mode selection process is described further herein but until now it has been assumed that the selected modal data is already in the input data file 110 and ready to be processed together with the flight vehicle data. The title of the selected modes is placed, during mode selection, on the top of the selected modal data. Different sets of selected modes may also be present including different titles, and therefore the input data file 110 may contain more than one set of selected modes under different titles, a similar concept to containing more than one set of vehicle data. This is how the Flixan program package identifies which set of modal data is to be combined with a flight vehicle data set. The selected modes in the input data file 110 are identified by the Flixan program from the id label, "SELECTED MODAL DATA," above the title.

The Flixan program package includes two utility programs for managing the input data files 110: an input data set processing utility, and a utility for creating and processing batch data sets. The input data set processing utility is used to clean and manage input data files 110. It performs tasks such as selecting and editing an input data file 110, executing an individual program/data combination or a batch set, deleting or relocating a data set inside the same data file, or copying a number of selected data sets to another data file. A batch is a set of input instructions that command a utility program to process various sets of input data sequentially without any user 150 intervention, instead of requiring a separate execution of each program with its data. The batch mode execution speeds up the reprocessing of the input data files 110 after some data modifications. The batch creation utility described here is not only used to create new batch data sets, but also to modify existing ones and save them under a different title in an input data file 110. To create a set of batch mode instructions one must first plan the data processing sequence and test it outside the batch utility by running each individual program separately to make sure that each program/data pair runs successfully by itself and that there are no errors in the input data. In other words, debug each step individually. Then the batch utility can be used to create a set of batch instructions that will automate the entire process by running the batch data instead of the individual program steps. This utility may also be used to test the batch set by making sure that it runs successfully before saving it in the input data file 110.

Modal Data and Flex Modeling

As mentioned above, modal data defining structural flexibility modes is input data separate from input data defining rigid-body flight vehicle parameters, and is entered and collected separate from such rigid-body data and maintained in a separate modal data file 130 having a file extension (.mod). The mode selection program, which is a utility program within Flixan, post-processes the modal data file, scales, and extracts a smaller set of modes to be processed and combined with the flight vehicle rigid-body data. The selected set of flex modes is included and saved in the same input data file, below the vehicle rigid body data, under the label "SELECTED MODAL DATA." The flight vehicle modeling program 100 combines and processes the selected modal data with the rigid-body data which are both included in the input data file. The resulting compiled input data file 110 includes data from the rigid-body input data and selected/rescaled modal data parameters for the desired flight vehicle modeling.

The structural flexibility of the flight vehicle is characterized by a number of bending modes, each defined by parameters such as mode frequency, damping coefficient, generalized mass, and the generalized mode shapes at key flight vehicle locations (nodes), such as the force application points and the sensors. Modal data includes a large number of mode frequencies and shapes and is derived from a finite elements model of the structure at a fixed configuration. A full modal data file 130 has a title which identifies the flight vehicle configuration followed by a line that defines how many modes and how many nodes are included. The modal data file 130 also includes a group of mode shapes data at each modal frequency. Each line represents a node and contains the node ID and six mode shapes at each mode, three translations along the vehicle x, y, z axes, and three rotations about the x, y, z axes. A typical modal data file 130 includes hundreds of modes from a Nastran output at a number of locations and is created by post-processing the Nastran output data using a separate user-supplied program to reformat the data in the standard (.mod) format required by the flight vehicle modeling program 100. When generating a modal data file 130 from a big Nastran output, one should select a sufficient number of nodes (locations on the structure, typically 20 to 40 nodes), even if one is not sure that all of them will be needed. This is because it is easier to ignore some of the nodes when developing the vehicle model than to need it later, in case one needs an additional sensor, for example, and not have a node for it. Some important nodes to include in the modal data file 130 are locations of the engine gimbals, control surface hinges, CMGs, reaction wheels, sensors such as IMU, accelerometers, gyros, and the angle of attack sensors, the locations of the slosh masses, and a disturbance input for applying a disturbance force.

The mode selection utility program uses also a smaller file associated with the modal data file 130. This smaller file is a nodes lookup table, also referred to as map, having an extension (.nod), and is created by the user 150. It contains a list of the structural nodes which are in the modal data file 130. This lookup file includes a title followed by several lines, each line defining a node. Each line contains a short description of the corresponding vehicle location, a node number starting from 1 to as many nodes as they are in the table, the node ID which is a large and unique number that identifies the node in the Nastran model, and the x, y, and z location of the node in vehicle coordinates. The number of nodes and their sequence in the map corresponds to the number of nodes and the node sequence in the modal data file 130. The lookup file is used by the mode selection program in menus and dialogs that help the user 150 to identify vehicle locations that correspond to actuator and sensor positions.

Flexibility Mode Selection

In embodiments introducing flexibility into the flight vehicle modeling program 100, the present invention requires a selected set of flexure modes which are processed together with the rigid-body flight vehicle data. The selected modes are not the same ones defined in the modal data file 130, but are a smaller set of modes which are combined into the input data file 110. Mode selection is the process of going through the modal data file 130 and extracting a smaller set of modal frequencies at fewer vehicle locations, i.e. only at the locations which are specified in the vehicle input data. A utility program facilitates mode selection and performs this mode selection process to prepare the smaller set of modes that will be processed by the flight vehicle modeling program 100.

The modal data file 130 includes several hundred bending modes. Most frequently, however, a small number of modes (less than 50) will be sufficient to determine the vehicle stability and performance with sufficient accuracy. The original modal data file 130 may also include many locations (nodes), most of which may not be needed for a particular model. Only the nodes that correspond to vehicle locations which are defined in the input data, such as the engines, surfaces, and sensors, need to be included in the selected set of modes. The mode selection program provides the capability to compare the modes in terms of strength and select a smaller number of modes which are strong in a certain direction between different parts of the vehicle. The selection is based on the modal strength which is a measure of combined controllability and observability of each mode between the actuators and sensors. The selected mode frequencies and shapes are saved in the input data file 110 to be used by the flight vehicle modeling program 100. The mode selection utility program also scales the modal data to match the vehicle data. The modal data is usually computed by a finite elements modeling program in units and axial directions different from those defined in the flight vehicle data. The utility program provides the user 150 with the capability to scale the selected modal data and converts them to units compatible with the vehicle rigid body parameters before saving them.

In one example of mode selection, the user 150 may also select a range of modes to be compared. In the following example, the user 150 specifies the number of excitation force and torque points (which do not necessarily correspond to vehicle actuator points, but they are used strictly for mode selection purposes), the number of translational and rotational sensor points (which do not necessarily correspond to vehicle sensor points, but they are used strictly for mode selection purposes), the axis of interest (i.e. modes which are dominant in roll, pitch, or yaw directions), and the number of modes to be selected. The mode selection program provides the option to either auto-select the strongest modes or manually select the strongest modes by means of a graphic display of modal strengths.

The user 150 may repeat the mode selection by trying different number of actuator and sensor points, types, and directions to see how the mode selection results may vary. The user 150 then also identifies the excitation and sensor points on the structure to be used for mode selection only. In the example, in which the user 150 specified force excitation points for mode-selection, it is notable these locations are only for mode selection purposes and need not represent actual vehicle locations at the gimbals and the flight control sensors, which will be defined later. The next step in the example is to identify the nodes for the excitation points, and the nodes for the translational and rotational sensors. The mode selection program provides menus where the user 150 defines these excitation and sensor points and also their directions. The program displays the nodes map in menu form which helps the user 150 to select the excitation and sensor locations. The selection points to a node number and its corresponding mode shapes in the modal data file. Based on the mode shapes (translations and rotations) at the excitation and sensor points the program calculates the modal strength at each mode frequency.

The modal strength for each mode is determined by the values of the mode shapes at the nodes where the forces and torques are applied and their directions, and also by the values of the mode shapes or slopes at the sensors and their measured directions. High mode shape values at the excitation and sensor points imply strong contribution from that mode. The mode selection program calculates the mode strength for each mode and saves it in a separate file.

Before allowing the user 150 to select which modes to retain from the modal data file 130, the user 150 enters additional information. The mode selection program will create a much smaller subset of the original modal data set and save it in the input data file 110. The selected modal data set will contain only the selected few dominant modes and modal shapes only at a few locations that play important role in the flight vehicle model. A very similar selection process is used in selecting nodes that correspond to vehicle engines, control surfaces, torque actuators, sloshing fuel, a disturbance point, and flight control sensors as defined in the vehicle input data.

At this point the mode comparison is complete and the user 150 selects the dominant modes, either automatically or graphically by means of a bar chart displaying modal strength versus mode number. Before exiting mode selection the user 150 may type in some comment notes regarding the mode selection process, describing, for example, what types of modes have been selected, and the conditions of mode selection, excitation points, measurement points, directions, etc. This information will be included as comment lines near the top of the selected modes, below the title. A default title defining the selected modes is placed on the top of the data. This title can be changed as needed to better define the selected modes. The title of the selected modes must also be included in the last line of the vehicle input data set (below the line that specifies the number of flex modes) in order for the flight vehicle modeling program 100 to associate the selected modes with the vehicle data. The selected modal data consist of the mode shapes and slopes (three translations along x, y, z, and three rotations about x, y, z) at every selected mode frequency.

Output Systems File

The flight vehicle state-space system data forms quadruple matrices which are saved as a system in the output data file 120, also referred to herein the system file 120. A system file 120 has a filename extension (.qdr) and may include several systems or single matrices related to a certain vehicle configuration or flight condition study. Each system or matrix is identified by a unique title. The flight vehicle system uses the same title as the title in the input data file 110. The user 150 notes that were entered as comments below the title in the input data file 110 will also be transferred as comment lines into the system file 120, below the system title. Definitions of the vehicle model inputs, states, and outputs are also included below the (A, B, C, D) matrices.

The present invention includes a file management utility for maintaining clean and organized system files 120 in control analysis projects. It is similar to the input data file processing utility with some differences. The user 150 can delete some older systems or matrices from the system file 120, move them to a different location from the top of the system file 120 in a logical sequence, edit the system file 120 using a standard text editor, display the system matrices using color coded graphics instead of actual numbers, display tables of the system inputs, states and outputs, write and display comments/user notes that describe a system or a gain matrix, and modify them graphically using windows and dialogs. The user 150 may also transfer some systems or gain matrices to different system files 120. Maintaining organized system files by means of comments, labeling the system inputs, states, and outputs, keeping the systems and matrices in a sequential order, and deleting the unused older versions can be a very attractive feature for documenting, especially when the user 150 discontinues the analysis for a while to resume it later.

Each system file 120 may contain several systems and matrices. Each state-space system includes: (a) a title, (b) some comment lines (optional) starting with an exclamation mark {!}, (c) the system size in terms of number of: Inputs, States, and outputs, (d) the sampling period (dT) if the system is discrete (otherwise zero), (e) the (a, b, c, d) matrix data, and (f) definitions of the system states, inputs, and outputs which are also optional. A sample of system data in a system file 120 is shown below.

---

STATE-SPACE SYSTEM ...
ROCKET PLANE AT MACH=0.85, Q=150, T=1778.0 sec (Pitch RB)
!
! Pitch Axis Model Extracted from the Coupled Rigid Body Axes Model
!
Number of Inputs, States, Outputs, Sample Time dT (for discrete) = 3 2 3 0.0000
Matrices: (A,B,C,D)

Matrix A                         Size = 2 × 2
           1-Column              2-Column
  1-Row   −0.30138585E+00       −0.39838865E+01
  2-Row    0.99731876E+00       −0.29373747E+00

---

Matrix B                         Size = 2 × 3
           1-Column              2-Column              3-Column
  1-Row   −0.36336161E+01       −0.36336161E+01       −0.25937799E−02
  2-Row   −0.21435051E−01       −0.21435051E−01       −0.22487362E−03

---

Matrix C                         Size = 3 × 2
           1-Column              2-Column
  1-Row    0.10000000E+01        0.00000000E+00
  2-Row    0.00000000E+00        0.10000000E+01
  3-Row   −0.22074682E+01       −0.25042853E+03

---

Matrix D                         Size = 3 × 3
           1-Column              2-Column              3-Column
  1-Row    0.00000000E+00        0.00000000E+00        0.00000000E+00
  2-Row    0.00000000E+00        0.00000000E+00        0.83712588E−03
  3-Row   −0.17702788E+02       −0.17702788E+02       −0.18556683E+00

---

Definition of System Variables
Inputs  =  3
  1     Left Rudder Deflection (rad)
  2     Right Rudder Deflection (rad)
  3     Gust Azim, Elevat Angles=(45,45) (deg)
States  =  2
  1     Pitch Rate        (q-rigid)     (rad/sec)
  2     Angle of attack   (alfa-rigid)  (radians)
Outputs =  3
  1     Pitch Rate   (q-stab)   (rad/sec)
  2     Angle of attack, alfa, (radians)
  3     CG Acceleration along Z axis, (ft/sec^2)

---

As noted earlier, an output file may also include, in addition to systems, a single matrix. The example below shows a system file comprised of a single gain matrix.

---

GAIN MATRIX FOR ...
Vehicle, Coupled Model, Max_Q T=55 sec
!
! This is a matrix that was created using the Flixan 2 program.
! One more comment. It is a TVC Mixing Logic. It translates the
! Roll, Pitch, and Yaw acceleration demands into pitch and yaw
! engine deflection commands. The inputs and outputs are defined
! below.
Matrix K2                        Size = 10 × 3
           1-Column              2-Column              3-Column
  1-Row    0.00000000E+00       −0.33481212E+00        0.00000000E+00
  2-Row    0.42072877E−01       −0.34527500E+00       −0.76731573E−02
  3-Row   −0.42072877E−01       −0.34527500E+00        0.76731573E−02

-continued

| | | | |
|---|---|---|---|
| 4-Row | 0.25131532E+00 | −0.55578813E+00 | −0.45834326E−01 |
| 5-Row | −0.25131532E+00 | −0.55578813E+00 | 0.45834326E−01 |
| 6-Row | 0.28624342E+00 | 0.00000000E+00 | −0.41166570E+00 |
| 7-Row | 0.20227759E+00 | 0.00000000E+00 | −0.40758536E+00 |
| 8-Row | 0.20227759E+00 | 0.00000000E+00 | −0.40758536E+00 |
| 9-Row | −0.14377220E−01 | 0.00000000E+00 | −0.59408361E+00 |
| 10-Row | −0.14377220E−01 | 0.00000000E+00 | −0.59408361E+00 |

Definitions of Matrix Inputs (Columns): 3
Roll    Acceleration About Vehicle X Axis
Pitch   Acceleration About Vehicle Y Axis
Yaw   Acceleration About Vehicle Z Axis
Definitions of Matrix Outputs (Rows): 10
TVC Output # 1 to Engine No: 1 Pitch Deflect
TVC Output # 2 to Engine No: 2 Pitch Deflect
TVC Output # 3 to Engine No: 3 Pitch Deflect
TVC Output # 4 to Engine No: 4 Pitch Deflect
TVC Output # 5 to Engine No: 5 Pitch Deflect
TVC Output # 6 to Engine No: 1 Yaw Deflect
TVC Output # 7 to Engine No: 2 Yaw Deflect
TVC Output # 8 to Engine No: 3 Yaw Deflect
TVC Output # 9 to Engine No: 4 Yaw Deflect
TVC Output # 10 to Engine No: 5 Yaw Deflect The file management utility also includes menus to allow a user 150 to perform various operations on a system file 120. For example, a user 150 may move a system or a gain matrix from its current position inside the system file 120 to a new position relative to the top of the system file 120. A user 150 may also delete some systems or gain matrices from the system file 120. A user 150 may also graphically view a system or a gain matrix using color codes instead of actual numbers. Each matrix element appears like a small square and is a convenient way of viewing large matrices, instead of reading the actual numbers, since the color indicates the magnitude of each element, which in general is sufficient information. In one embodiment, numbers with high positive exponent gravitate toward the green, blue, and cyan, and numbers with high negative exponent gravitate toward the orange, red, and brown. Zeros are black and ones are bright white. Negative numbers have the minus (−) sign in front of the colored square. The actual value of each element can be seen at the bottom of a display dialog. The user 150 may also read or modify the element value using the number entry field at the bottom of the display. All the available information about the system or matrix can be viewed or modified by this dialog.

The file management utility also allows users 150 to select some state-space systems or matrices from a system 120 file and copy them to another system file 120. After selecting a source file from the filename selection menu, the titles of the systems or gain matrices which are currently saved in that system file 120 are displayed. All the system titles, gain matrices, and control synthesis model titles are listed in the order that they appear inside the system file 120.

A user 150 may also choose a destination system file 120 where the data will be copied to. After selecting the destination system file 120, the display shows the highlighted systems or matrices that were selected from the source file to be copied in the destination system file 120. The selected systems or matrices will be added in the destination system file 120, and the display will change showing the titles of all the systems which are now present in the destination system file 120. The previous systems and matrices that were in that system file 120 will remain on the top and the newly copied ones will be added at the bottom of the system file 120. The present invention also includes a text editor to view or edit the selected system file 120.

The present invention includes additional system and matrix creation utilities. One such utility is for creating a new state-space system or a new matrix from scratch by entering the non-zero numbers in the matrix and saving it in a system file 120. When selecting this utility the user 150 defines the new system title, its size in terms of number of inputs, states, and outputs, and the sampling period if it is a discrete system described in terms of state-space difference equations. Otherwise, for a continuous system the sampling period is set to zero. The user 150 also defines the system file 120 where the new system or matrix must be saved. Using a tool for entering the matrix elements and its state-space variables, non-zero numbers are entered individually. In one embodiment of the present invention, after entering the numbers, each matrix element appears in different colors depending on the magnitude of the element. Small magnitude elements appear in one color, while large magnitude elements appear in a different, distinguishable color. Ones appear bright white, zeros are black, and there is a range of colors in between depending on the magnitude. Negative numbers are shown with a minus sign on the top of the matrix element. The user 150 must also enter the system title, a short description of the system (optional comments), and may also define the system inputs, states, and outputs. Initially the inputs, states, and outputs are assigned some default definitions by the program. To change the input labels into something more descriptive, the user 150 overwrites the old label with a new input label, and may select another input and enter a new label.

Figure 2:
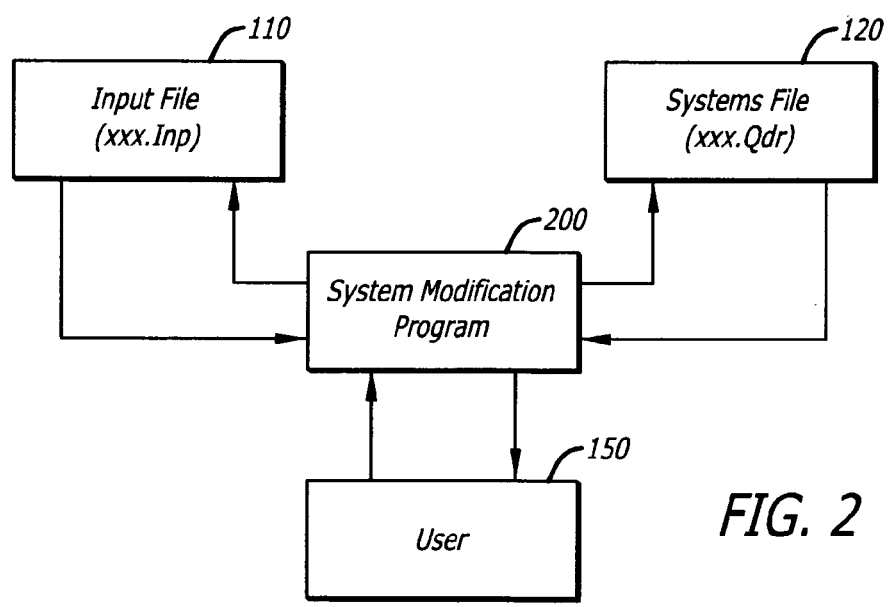
FIG. 2 is block diagram of inputs and outputs of a system modification utility of a flight vehicle modeling program according to one embodiment of the present invention.

Referring to FIG. 2, the present invention also includes a utility program 200 used to modify, recondition or simplify an existing state-space system. For example, the analyst may want to replace the system outputs with a new set of outputs, or change the units of the system parameters, or to eliminate some unnecessary inputs, states, or outputs. The system modification program 200 reads the state-space system from a system file 120 and can create a new system by modifying the old system's inputs, states, and outputs and by performing certain operations. These include an operation to rescale the original system variables by converting the units of the old system's inputs, states, and outputs into a different set of units. The conversion is performed by scaling the old state-space system variables by a constant (S), where the old units= (S) times the new units. Another such operation creates a new system by replacing the old system outputs with a new set of outputs which are made up from a combination of some of the old system's outputs, states, and the derivatives of the old system outputs and states. This option is useful for extracting derivatives of outputs which are often needed for optimization in LQG or H-infinity control design models, where state or output derivatives are often included in the criteria optimization vector. The system modification program 200 can also be used to simplify a system by eliminating some of the old system's inputs, states, or outputs which are not needed, or it can be used to decouple state-space systems, separating, for example, a coupled flight vehicle model into separate pitch and lateral systems by eliminating the variables which belong to the other axis. This option can also be used to change the sequence of the new system's inputs, states, or outputs.

In the system modification program 200, the input data file 110 includes the system modification instructions, assuming that the instructions set has already been saved there from a previous application. Otherwise, the user 150 will define (by means of GUI utilities) the system modification instructions which will be saved in the input data file 110 for a later use. The system file 120 includes the state-space system that will be modified by the program using the reconditioning instructions. The modified system will also be placed in the same system file 120.

When the system modification instructions are already in the input data file 110, the user 150 need only to define the two file names and select the new system title. A set of input instructions for system modification is recognized by the system modification program 200 from a label in the input data file 110. The system modification program 200 searches through the input data file 110, identifies all the system modification data sets and lists their titles in a menu. The user 150 selects one of the titles from the menu, and the new system will be identified by this title. The system modification program 200 reads the input instructions and computes the modified state-space system from the old system.

If the system modification instructions are not in input data file 110, the systems modification program 200 can create a new set of system modification instructions. The system modification program 200 obtains the system reconditioning instructions as directed by the user 150, saves them in the input data file 110 and runs them. The user 150 selects the system to be modified and the system modification program 200 reads the state-space matrices of the selected system and creates a title for the new system. The user 150 can then define the new system title, choose one of the three system modification program options, and enter some comments or notes describing the new system. To choose modification options, a menu below the title shows the three system modification options appears, and the user 150 highlights one of the options. Before selecting an option the user 150 may also type in some system description comments. The user notes will also be inserted as comments in the data files and will become available to other utility programs.

The system modification program 200 is then ready to accept the system modification instructions provided directly by the user 150. Each system modification option requires different instructions and it will be described separately herein. The system modification instructions are saved in the input data file 110 and the system modification program 200 runs them in order to generate the modified system. A user 150 may want to include more than one modification in the same data set. Therefore, after completing one set of instructions the system modification program 200 returns to the menu below where an additional modification option can be included in the set before creating the final system. The system modification program 200 runs the new instructions and creates the newly-modified system, and this newly-modified system's matrices are saved in the same systems file under the newly-modified title.

One system modification option is titled Entering Instructions to Rescale a System and is used for converting the units of some of the system inputs, states, or output variables from one type of units to another. Converting, for example, a system whose inputs are defined in pounds and its outputs in feet to a dynamically equivalent system whose inputs are defined in kilograms and its outputs are in meters. This utility can be used, for example, to transform a given plant model in order to combine it with a controller or an actuator systems that have been defined in different units. In order to rescale a state-space variable from an old set of units to a new set of units the user 150 must specify a scaling factor defined so that one old unit is equal to "S" times the new unit. If a force input, for example, was defined in (lb) and it must be converted to (oz), the scaling factor S=16. If the old system output was in (feet) and it must be converted to (inches), the scaling factor S=12. For this option, the user 150 is prompted to select the system inputs, states, or outputs that need to be scaled. The user 150 selects one set of variables to be trans-formed at a time, that is, either the inputs, the states, or the outputs. If, for example, the user 150 wants to transform some of the inputs, the systems modification program 200 opens another menu listing the system inputs as they are defined in the system file below the matrices. The user 150 selects one of the inputs from the inputs name-list, and enters the unit conversion factor "S." The system modification program 200 returns to the list of inputs and the user 150 can rescale another input. After finishing re-scaling the inputs the user 150 may rescale some of the outputs or some of the states. Re-scaling a system's input is performed by dividing with the scaling factor the corresponding column in matrices B and D. Similarly, resealing a system's output is performed by multiplying with the scaling factor the corresponding row in matrices C and D. Resealing the states affects only matrices A, B, and C. The user 150 need not rescale the states in order to combine two systems together.

Another system modification option in the system modification program 200 is titled Instructions to Create a New Set of Outputs and is used to create a new system with a new set of outputs from an old system that already exists in the system file 120. The new outputs can be selected from the following: (a) the old system outputs, (b) its output derivatives, (c) the old system states, and (d) the derivatives of the states. This utility is useful in preparing synthesis models for control system design which require additional output criteria to be optimized. After selecting the system to be modified the user 150 may enters the new system title and some user 150 reference notes at the bottom. The process can be repeated many times until all the desired outputs are included, one at a time, from the four groups. The system modification program 200 returns to the previous system modification options menu and the system modification program 200 executes the instructions of creating a new system with new outputs. The new system with the newly selected outputs and the modified title is saved in the same system file 120, below the original system. The definitions of the new system variables are also printed below the system (A, B, C, D) matrices.

Another system modification option is titled Entering Instructions to Truncate the System's Inputs, States, or Outputs, and is a utility that extracts a subsystem from the original system by selecting some of the old system's inputs, states, and outputs to be retained in the new system. It can be used to eliminate any uncontrollable and unobservable states, or to decouple a large system into smaller sub-systems. For example, it can be used to separate an aircraft model obtained from a six degrees of freedom modeling tool into two separate pitch and a lateral models which are decoupled. If the system truncation data is not in the input data file 110 from the filename selection menu push the "Enter a New Set" button as before. The user 150 then enters the new system title, the option of truncating a system, and some user notes as shown in the space below, and selects the system title to be modified. The user 150 then defines the inputs, states, and outputs that will remain in the new system. All the other system variables are eliminated. The system modification program 200 presents a dialog having tabs which list the old system inputs, states, and outputs, and the user 150 highlights the variables to be retained in each tab. The system modification program 200 then asks the user 150 to confirm before saving the modified system in the system file 120.

Running the Flight Vehicle Modeling Program

Once all input data to be used to model a flight vehicle have been collected, the user 150 selects the input data file 110 and the system file 120 where the vehicle state-space system will be saved. The flight vehicle modeling program 100 looks for the input data file 110 and starts searching for flight vehicle input data, which will be so labeled in the input data file 110. An input data file 110 may contain more than one set of vehicle data. Immediately below the flight vehicle label there is a title which identifies the vehicle data. Each set of vehicle data has a different title. When the flight vehicle modeling program 100 identifies vehicle data sets, it displays their corresponding titles in a menu. The user 150 may select some or all of the vehicle data sets to compile with the flight vehicle modeling program 100.

The flight vehicle modeling program 100 reads the selected vehicle data from the input data file 110 and displays the data in dialog form. The dialog may include many tabs that can be selected to view one group of vehicle data at a time. The title of the vehicle data which will also become the system title also appears in the dialog display.

The tabs allow viewing or entering data, one tab group at a time. Each tab displays different types of vehicle data. Different types of vehicle data shown in the tabs includes, but is not limited to, mass properties, trajectory, aerodynamic forces, gyros, control surfaces, engines, slosh data, accelerometers, and flexibility. The mass properties tag includes the vehicle mass, moments and products of inertia, CG location, local value of g, and the radius of the earth. The trajectory data tab shows the inertial velocity and acceleration, the sensed acceleration resolved along the body x, y, and z axes, the $\alpha$, $\beta$ trim angles, $\alpha$, $\beta$ rates, the Euler angles, the dynamic pressure, the steady-state body rates, vehicle altitude, Mach number, etc.

The aero forces tab shows the aero force coefficients at the trimmed condition ($C_{A0}$, $C_{Z0}$) and also the aero force derivatives per degree along (-x, +y, +z). $C_Z$ is defined to be along the z axis, in the opposite direction from the normal force coefficient $C_N$. The partials of the force coefficients with respect to altitude change (1/feet), and also the partials of the force coefficients with respect to velocity change in (1/ft/sec) are included in this group.

The gyros tab displays the gyros info as specified in the vehicle data, such as for example a pitch rate gyro. The dialog also shows its x, y, z location. The gyros may be defined in different ways, such as in rotations (radians), and can also be defined to measure rate in (rad/sec), and angular acceleration in (rad/sec$^2$).

The control surfaces tab includes the data for the vehicle control surfaces at a specified flight condition. The engines tab displays the information for the vehicle thruster engines. The engines are defined to be either gimbaling, or throttling, or both. The slosh tab includes parameters used for modeling propellant sloshing. Fuel sloshing inside a tank is represented by an oscillatory motion of a slosh mass resolved in two orthogonal directions (y and z) which are perpendicular to the sensed vehicle acceleration vector AT. The following parameters are needed for each tank: the slosh mass (slugs), slosh frequency (rad/sec), the damping coefficient ($\Box$), and also the location in (ft) of the slosh mass (un-deflected) with respect to the vehicle coordinates.

The accelerometers tab displays the accelerometers info as it is read from the vehicle input data file 110. Although referred to as accelerometers they can also be defined to measure position in (feet) or velocity in (ft/sec) along the x, y, or z directions. The accelerometer location in vehicle coordinates is also required because the accelerometer measurement is also sensing vehicle rotational acceleration. With the accelerometer sensors the user 150 has the option to turn off the rigid-body component from the measurement because there are some cases where it can be useful. The menus in the accelerometers tab are either used for setting or for viewing the accelerometer specifications.

A bending tab may also be included that displays the title of the flex modes that will be combined with the vehicle data. Also included is a "User Notes" tab used to display the comment lines in the vehicle input data, or to enter new comment lines when starting a new set of data.

After inspection of all the dialog tabs to verify that all vehicle data have been entered and read correctly, the flight vehicle modeling program 100 will create the vehicle state-space system and save it in the system file 120. The system defined in the system file 120 will have the same title as the title used in the input data file 110. The vehicle notes that were entered as comments below the title in the input data file 110 will also be transferred as comment lines into the system file 120 below the system title. Definitions of the system's inputs, states, and outputs will also be printed below the (A, B, C, D) matrices.

The flight vehicle modeling program 100 automatically creates definition labels for the vehicle state-space variables based on the vehicle configuration information as defined in the input data file 110. The vehicle control inputs include control surface deflections, TVC engine deflections, or engine thrust variations (normalized). When the tail-wags-dog (TWD) option is turned on we also have two additional inputs per surface or engine dof, the deflection rate and angular acceleration. All three inputs (deflection, rate, and acceleration) come from an actuator state-space model, discussed herein. When the TWD option for the engines or aero-surfaces is off, there is only one input per surface or engine dof, the deflection in (rad), in which case the actuator can be simplified as a first or second order transfer function.

Aero-Elasticity

Aero-elasticity is the dynamic coupling between aerodynamics and structural flexibility. To model aero-elasticity in the present invention, the flight vehicle modeling program 100 requires a Generalized Aero Force Derivative (GAFD) file that contains the aero-elastic coefficients that couple flexibility with aerodynamics and also the inertial coupling coefficients used to model the inertial coupling effects between the flexible vehicle and the control surface accelerations. The GAFD data includes several sets of coefficients. The GAFD data are located in a separate aero-elastic data file 140 that has a filename extension (.gaf) containing the coefficients required for the implementation of aero-elasticity, and also the inertial coupling coefficients. If the default flag "Without GAFD" option is used in the vehicle input data, the flight vehicle modeling program 100 ignores the aero-elastic effects and creates a simplified flex model using only modal data, assuming that flexibility is excited at the hinges by rigid surface rotations and accelerations, and also that the aero forces at the hinges are generated by flat panel rotations from their trimmed positions.

The GAFD file includes various sets of coefficients. The first set of coefficients describes how the vehicle aerodynamic forces and moments are affected by the modal displacements and modal rates. A second set of coefficients describe how the generalized modal displacement of a mode is excited by the vehicle motion, such as changes in angle of attack, sideslip, body rates, accelerations, control surface deflections, surface rates, and also by modal displacement, rate, and acceleration interactions with other modes. A third set of coefficients describe how the moments at the hinges of the control surfaces are affected by changes in the angles of attack, sides-lip, body rates, accelerations, modal displacements, modal rates, and also by the control surface deflections and rates. The hinge moments affect the actuator performance. The GAFD data also includes the rigid-body aerodynamic force and moment derivatives due to changes in angle of attack, sideslip, body rates, accelerations, control surface deflections, and surface rates. These coefficients, however, are not included in the aero-elastic data file 140, because the flight vehicle modeling program 100 uses more accurate aero-coefficients and aero-derivatives which are derived from wind tunnel tests and are included in the vehicle input data.

Running the Vehicle Modeling Program with the Aero-Elastic Data File

After the aero-elastic data is defined and assuming that an aero-elastic data file 140 has been prepared for all aerosurfaces and at frequencies that correspond to the selected mode frequencies (there may be more GAFD frequencies than selected modal frequencies but there should be a GAFD frequency for each of the selected mode frequencies) the flight vehicle modeling program 100 is ready to run with aero-elasticity included. After selecting the filenames, and vehicle data, the flight vehicle modeling program 100 brings you to the dialog with the tabs that display the vehicle data. The flight vehicle modeling program 100 displays more menus and dialogs because it must locate the GAFD file and process the data. It displays a menu that lists all GAFD filenames which are in the project directory.

The flight vehicle modeling program 100 reads the modal data for the selected flex modes, and also reads the GAFD frequencies and data from the aero-elastic data file 140. It is possible for the aero-elastic data file 140 to contain more frequencies than the selected modes. While some modes in the selected set of modes may have been excluded, we already have those frequencies included in the aero-elastic data file 140. It is also possible that the aero-elastic data file 140 may contain more control surfaces than those defined in the vehicle model. The user 150 instructs the flight vehicle modeling program 100 which GAFD frequencies need to be selected, and also which surfaces, corresponding to the ones included in the vehicle data. The flight vehicle modeling program 100 uses a dialog to select the GAFD frequencies that correspond to the selected modal data, and also the control surfaces in the aero-elastic data file 140 that correspond to the surfaces defined in the vehicle data. The set of frequencies include selected mode frequencies (via the mode selection utility). The user 150 selects only the GAFD frequencies that correspond to the selected mode frequencies.

The user 150 also specifies control surfaces because, just like the aero-elastic data file 140 may contain more frequencies than the modal frequencies, the GAFD file 140 may also contain more surfaces than the number of surfaces in the vehicle model. Once this has been the completed the flight vehicle modeling program 100 is able to compute the aeroelastic vehicle state-space model and save it in the system file 120 under the same title as the title used in the input data file 110.

Actuator Models and Modeling

Figure 4:
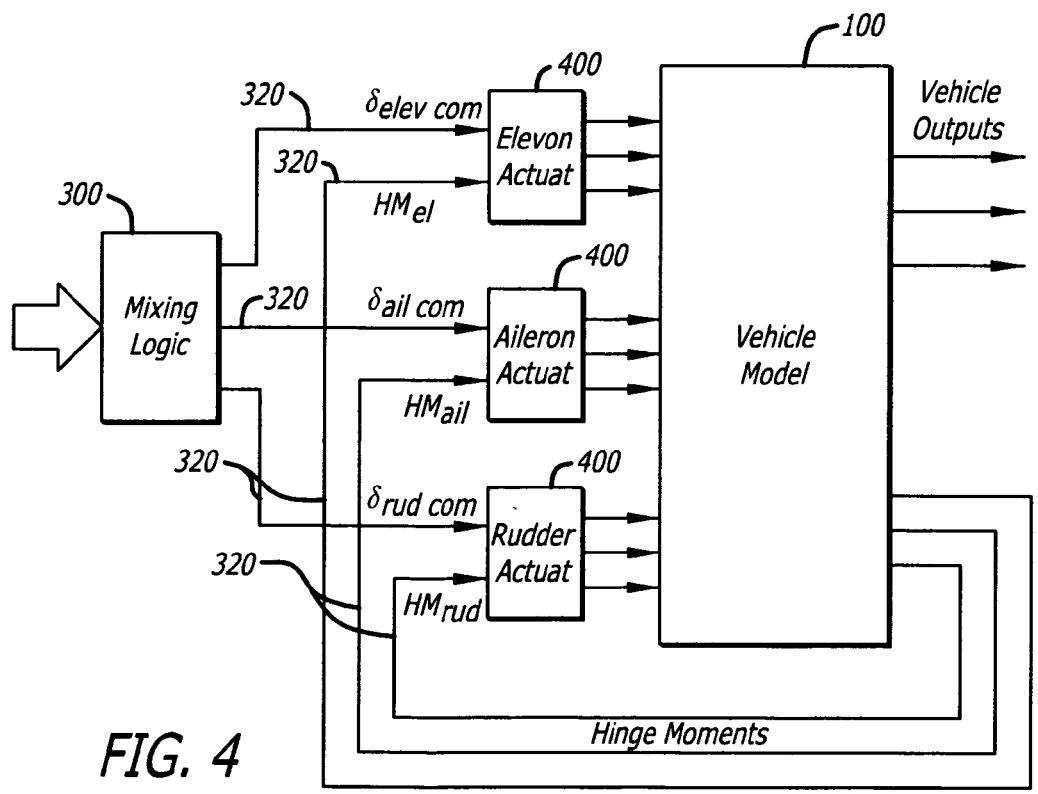
FIG. 4 is block diagram of inputs and outputs of a mixing logic utility and actuator utilities of a flight vehicle modeling program according to one embodiment of the present invention.
Figure 5:
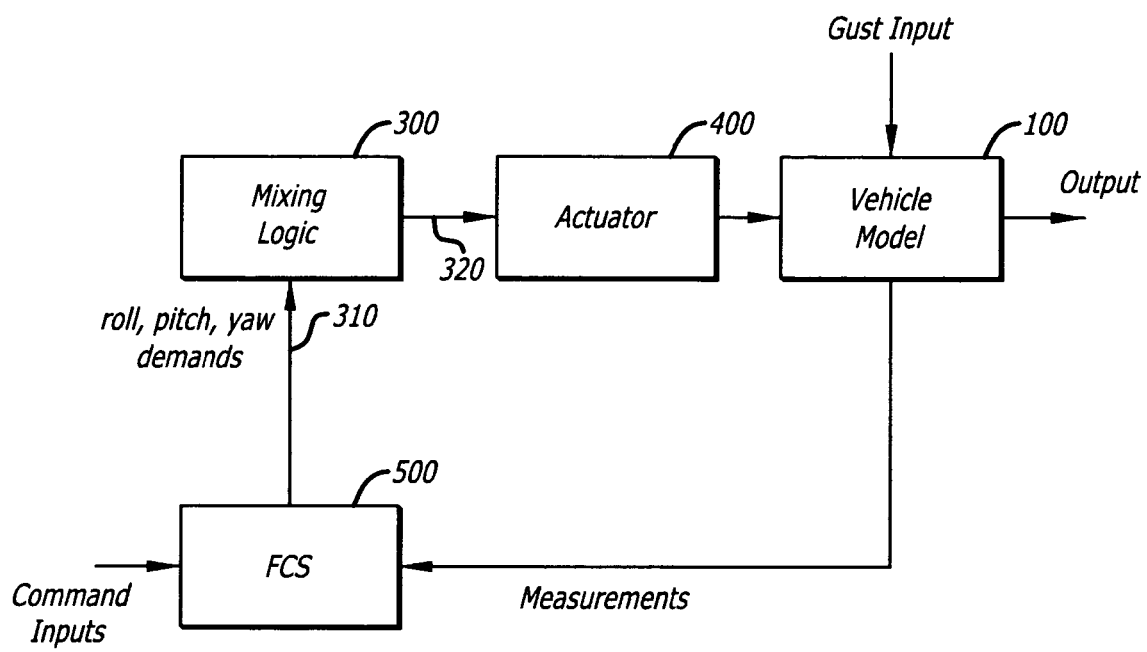
FIG. 5 is block diagram of inputs and outputs of a mixing logic utility and actuator utilities of a flight vehicle modeling program according to another embodiment of the present invention.

The actuator is an important element in modeling flight vehicle dynamics. In the present invention the actuator dynamics are created as a separate block that can later be integrated with the vehicle model. The actuator model does not only include the piston translation dynamics but also the engine or control surface rotational dynamics which include the load moment of inertia, vehicle back-up stiffness, moment arms, viscous damping, and other actuator parameters. FIG. 4 and FIG. 5 are interconnection diagrams showing inputs to actuator programs 400 with respect to the flight vehicle modeling program 100 and mixing logic 300.

Separate actuator programs 400 are used for different vehicle effector inputs. For example, gimbaling engines may utilize two actuator programs 400, one for pitch and one for yaw deflections. FIG. 4 shows a typical interconnection between the flight vehicle modeling program 100 and the control surface actuator programs 400. The actuator programs 400 generate outputs which are deflections in (radians), deflection rates, and accelerations (rad/sec$^2$), and which drive the other flight vehicle modeling program 100 inputs. The actuator program 400 inputs are deflection commands in (radian) and hinge moments in (ft-lb). The hinge moments include load-torque feedback in a mechanical loop from the flight vehicle modeling program 100 representing external loading on the actuator due to vehicle motion.

The present invention also includes the capability to specify actuator models for further modeling of the flight vehicle in a specific actuator program 400. Flight vehicles are controlled by engines that rotate about a gimbal or by control surfaces rotating about a hinge. The purpose of a servo-actuator system is to provide the force that is needed to gimbal the engine or to rotate the aero-surfaces in the direction needed to control the vehicle. In launch vehicles, a small rotation of the thrust vector angle about the gimbal (typically between ±5° and ±10° in pitch and in yaw) is sufficient to generate a significant amount of normal or lateral force at the gimbal that can be used to stabilize and steer the vehicle, overcome the wind-gust disturbances, and balance the aerodynamic moments. In an aircraft the control surface deflections are larger, in the order of ±40° from the trim position. The surface rotates about a hinge line parallel to a wing or a vertical stabilizer, and the actuator provides the force to rotate it against the aerodynamic loads. In some aircraft the whole wing, flap, or rudder is rotating and not just the trailing end of the control surface. The rotation of the surface changes the airflow around the aircraft and creates the aerodynamic forces and moments needed to trim and to control the flight vehicle.

Thrust forces are transmitted to the vehicle through the gimbal. The launch vehicle gimbals are usually two-directional allowing the engines to rotate both in pitch and yaw directions. The actuator is a mechanical servo device that is used to control the deflection ($\delta$) of the engine. A TVC engine is controlled by two orthogonal actuators, typically in pitch and yaw directions. The actuator length can be varied by means of hydraulic or electro-mechanical forces which extend or retract the shaft. One end of the actuator is attached to the flight vehicle and the other end of the shaft is attached to the nozzle. The angular position of the nozzle is controlled by adjusting the length of the actuators. During flight, the desired pitch and yaw changes in engine rotation are computed by the flight control system and the actuators are commanded to either extend or retract in order to achieve the required changes in nozzle deflection.

In order to properly model the dynamic coupling between the flight vehicle and the control surfaces or the TVC engines, some standard actuators must be derived that are included as selectable model options. Each actuator modeling program 400 reads the actuator parameters from the input data file 110 and creates different types of actuator state-space models which are saved in the system file 120. The actuator state-space models are combined with the flight vehicle models in order to capture dynamic effects such as tail-wags-dog, hinge moment, and load-torque feedback, which couple also with vehicle structural bending. Actuator parameters may include piston area, moments of inertia of the load, amplifier gains, friction coefficients, piston and backup stiffnesses, compensator transfer functions, etc. The actuator modeling program 400 operation is very similar to the flight vehicle modeling program 100. The output is a state-space system that captures the actuator plus load dynamics. It is saved in a system file 120 with its inputs, states, and output variables defined below the matrices. Actuator models usually have two inputs and three outputs. The two inputs are: (1) engine deflection command ($\delta_c$) in radians, coming from the flight control system output, and (2) the load torque ($T_L$) in (ft-lb), which is an external loading torque on the actuator due to the vehicle motion. The three outputs are: (1) engine deflection angle ($\delta$) in (radians), (2) engine rate in (radians/sec), and (3) engine acceleration in (rad/sec$^2$).

The selection of an actuator device is determined mainly by the power requirement of the load. The power is determined by the aerodynamic forces and the speed of response. A flight vehicle can be better controlled when it is marginally stable. If the vehicle is passively unstable and it diverges too fast, then the actuator has to respond fast enough in order to catch up with the instability and prevent it. On the other hand, if the vehicle is too stable it also requires a lot of actuator power in order to steer it. Other factors to be considered for the selection of an actuator include the dynamic characteristics, the power sources available, the reliability of the equipment, and other physical and economic limitations.

Combining a Flexible Vehicle Model with Actuators

The actuator models include the rotational dynamics of the load and calculate the angular position, velocity and acceleration of the engine or aero-surface relative to the vehicle. This relative motion of the load is used as an input to the flight vehicle model which generates the control and reaction forces. In FIG. 4, three control surfaces actuator models 400 are shown, created by the actuator modeling program. They are known as elevon, aileron, and rudder actuators. There is a mixing logic 300 matrix that converts the flight control system 500 output as shown in FIG. 5 to actuator system inputs 320. The control surface deflection, rate, and acceleration outputs drive the vehicle dynamic model created by the flight vehicle modeling program 100. In addition to other outputs the flight vehicle model also generates the hinge moment outputs which are fed back to close the mechanical hinge-moments feedback loop at the control surface hinge moment inputs. In the present invention, the actuator models 400 are combined with the flight vehicle models 100 using a systems combination utility, or by using other commercially available tools.

The user 150 should take care in selecting stiffnesses when putting together vehicle and actuator models. There are three types of stiffnesses involved when dealing with actuators and they combine in series to define the combined load resonance: (1) the stiffness of the backup structure, which is the structural stiffness at the point where the actuator piston is attached to the vehicle, (2) the actuator shaft stiffness consisting of piston plus oil or electrical stiffness, and (3) the load stiffness due to the flexibility of the aero-surface itself, or the engine nozzle. When we are dealing with a rigid vehicle model, all three stiffnesses must be included in the actuator model and the actuator model captures the local resonance of the load oscillating at the pivot. The deflection ($\delta$), the rate, and the acceleration outputs consist not only of rigid surface rotation, but also the additional deflections due to the combined spring constant ($K_T$) from all three stiffnesses. The position feedback loop in the actuator is a measurement of the actuator shaft extension. The position sensor measures the actuator shaft translation which includes also the error due to the shaft deformation. The measurement does not see the backup structure or load deformation. All three stiffnesses should be included in the actuator model when: (a) the vehicle is a rigid body, or (b) vehicle is flexible but the actuator link stiffnesses are set to "rigid" in the finite-elements-model. When the flight vehicle is flexible and the backup and load structure compliances are included, they should not be included in the actuator. Only the piston stiffness should be included, otherwise, the stiffnesses will be included twice.

The actuator modeling tool includes several actuator modeling options, some of which are described herein by way of example. Electro-hydraulic actuators are most commonly used for launch vehicle thrust-vector-control, and have great power capability and can deliver larger torques than electrical equipment of comparable size and weight. For continuous operation, they offer a minimum (equipment/power) ratio. Where intermittent operation is required, a hydraulic system can provide large amount of power from a small volume of accumulator. Their dynamic characteristics are expressed by small time constants, and they develop higher (peak torque/inertia) ratios.

The most common form of utilization of hydraulic servos in vehicle control loops consists of a high pressure supply (pump), an electro-hydraulic servo valve, a hydraulic actuator (cylinder), a feedback transducer, and a servo-amplifier. The hydraulic power supplies currently used are of two main types. The first type employs a variable displacement pump whose output flow is controlled by means of a servo sensing the high pressure side of the hydraulic system. A relief valve is also connected from the high pressure side to the low pressure side to minimize pressure transients above the operating pressures of the system. For normal operations the valve remains closed, opening only when the pressure exceeds a value overcoming the pre-load on the relief valve. The second type of power supply uses a fixed displacement pump with a relief valve to maintain the supply pressure within set limits, as well as to meet the normal flow requirements. In this system the relief valve is normally open so that supply pressure and valve opening maintain flow through the relief valve equal to the flow output of the fixed displacement pump. When there is a flow demand the relief valve closes and the supply pressure is reduced. The dynamics of both power supply and relief valve exhibit a fairly flat response with small phase shift within the bandwidth of the overall servo loop, therefore, the supply pressure will be assumed to be constant at the value of zero flow demand. Electro-hydraulic valves are designed for flow or pressure control. These units are highly complex devices and exhibit high order non-linear responses. Still, in the frequency range of interest, they can be represented by a first or second order transfer functions.

Other types of actuators are electro-mechanical actuators, mainly because of their simplicity, reliability and the reduced need for maintenance in comparison with the hydraulic systems. In the heart of an electro-mechanical actuator system there is a DC motor. At the rotor of the motor there is a small gear driving a bigger gear for higher torque. The bigger gear is connected to a screw gear that spirals as the gears rotate. The spiral gear converts the rotational motion into translation that drives the actuator shaft. The other end of the shaft rod is connected by some linkage mechanism to the load which can pivot about a hinge with respect to the vehicle. As the piston pushes against the load it rotates the nozzle or the control surface similar to the hydraulic actuator. The electro-mechanical actuator system has two gear ratios. The first gear ratio relates the number of motor spins to one rotation of the big gear, and the second gear ratio defines the number of motor spins for one inch extension of the piston. A current amplifier supplies the dc current required to drive the motor. The servo loop is closed by means of a position measurement across the actuator. A rate feedback loop from the motor velocity is also closed in order to achieve the desired damping characteristics.

Combining Effectors Via a Mixing Logic Matrix

Flight vehicles are controlled by forces and moments generated by either gimbaling or throttling the thruster engines, by firing reaction control jets, or by deflecting control surfaces. The engines or surfaces are commanded by the flight control system. The signals coming out of the flight control system as outputs 310 are the roll, pitch, yaw, Ny, and Nz-demanded changes in the vehicle body rates. The logic that interfaces between the flight control system outputs 310 and the vehicle effectors is the mixing logic 300. Note, that for a vehicle that has only gimbaling engines the mixing logic 300 is referred to as the Thrust Vector Control (TVC). The more general effector mixing logic 300 is essentially a matrix that converts the flight control system outputs 310 to effector input commands 320. The mixing logic 300 therefore translates the roll, pitch, and yaw angular accelerations demanded by the flight control system 510 into commands 320 such as engine or control surface deflections, thrust variations (for differential throttling), or RCS jet ignition commands. The mixing logic matrix 300 is generally time-varying because it is a function of the vehicle geometry, thrust, alpha, and mass properties. The mixing logic 300 algorithm that is presented here uses the pseudo-inverse method to determine the best combination of controls to effectively achieve the required change in vehicle rates. By applying the mixing logic in front of the vehicle model as in FIG. 5 it attempts to diagonalize it, that is, the achieved vehicle accelerations approach the commanded accelerations in the open-loop sense.

The effector combination program generates the mixing logic matrix by calculating the force and moment variations in the vehicle body axes produced by each effector independently. In other words, it calculates the force and moment variations due to gimbaling, throttling, and also due to a control surface deflection. The effect of each effector in the control directions is a column vector, and the vectors from all effectors are combined together to form a matrix for the total vehicle moments and forces due to the contributions from all the vehicle effectors. The mixing logic is the pseudo-inverse of that vector. One additional mixing logic 300 calculation is the maximum effectiveness of each effector. This calculation is relevant here because the various engines or aero surfaces may have different max gimbaling angles or throttling capabilities. The mixing logic 300 therefore utilizes the effector contributions according to their effectiveness, by spreading the control authority evenly among the effectors proportionally according to their capabilities. This type of mixing logic 300 maximizes the control effectiveness by allowing all the effectors to reach saturation simultaneously. For example, if two engines have equal thrust but different gimbaling capabilities, the engine with the larger rotational capability should be allowed to deflect at a larger angle.

The mixing logic option is embodied within the flight vehicle modeling utilities in Flixan program. The flight vehicle modeling program 100 requires the input data file 110 in order to obtain the vehicle mass properties and effector data. It looks inside the input data file 110 and searches for flight vehicle data sets and lists all the vehicle data titles in a menu, from where the user 150 selects a vehicle set to be used for creating a mixing logic 300 matrix. The user 150 will notice that the same vehicle input data set is also used by the flight vehicle modeling program 100 to compute the vehicle state-space model, which is also saved in the same output system file 120, together with the mixing logic 300 matrix.

The user 150 chooses a name for the mixing logic 300 matrix, and also the rotational and translational directions to be controlled (for example, roll, pitch, yaw, and z-acceleration), which serve as inputs 310. The directions chosen should be accessible by the vehicle effectors. The three most typical rotations are roll, pitch, and yaw. Translational directions may also be included if the vehicle has the effectors to provide control along these directions (such as speed brake, flaps, throttle control, etc.). The mixing logic 300 reads the vehicle mass properties, CG location, engine locations, thrusts, maximum deflections, aero-data for the control surfaces, etc., and uses these vehicle parameters to compute the mixing logic matrix. The inputs 310 to the mixing logic 300 matrix are derived from the flight control system output as shown in FIG. 5. The matrix outputs drive the vehicle control effector inputs, such as gimbaling engines, throttling engines, reaction control jets, or aero surfaces, as specified in the vehicle input data.

The mixing logic matrix is integrated with the flight control software and converts the desired changes in vehicle rates (roll, pitch, and yaw), and linear accelerations (along x, y, and z) to outputs that serve as effector commands. The number of rows (outputs) is equal to the number of effector degrees of freedom. The number of columns (inputs) is equal to the number of vehicle degrees of freedom that must be controlled (max number of 3 rotations plus max number of 3 translations). The number of vehicle degrees of freedom that are included in the mixing logic 300 matrix should be limited by the number of degrees of freedom which can be accessible by the effectors in the vehicle state model. The control designer should know ahead of time which vehicle directions are controllable and select them using the six direction options menu. Typically, three rotations are chosen and sometimes one or two translations. For example, if the vehicle has throttle control or a speed-brake you may also include the x-axis acceleration. Flaps can also be used to control the z-axis acceleration.

Figure 3:
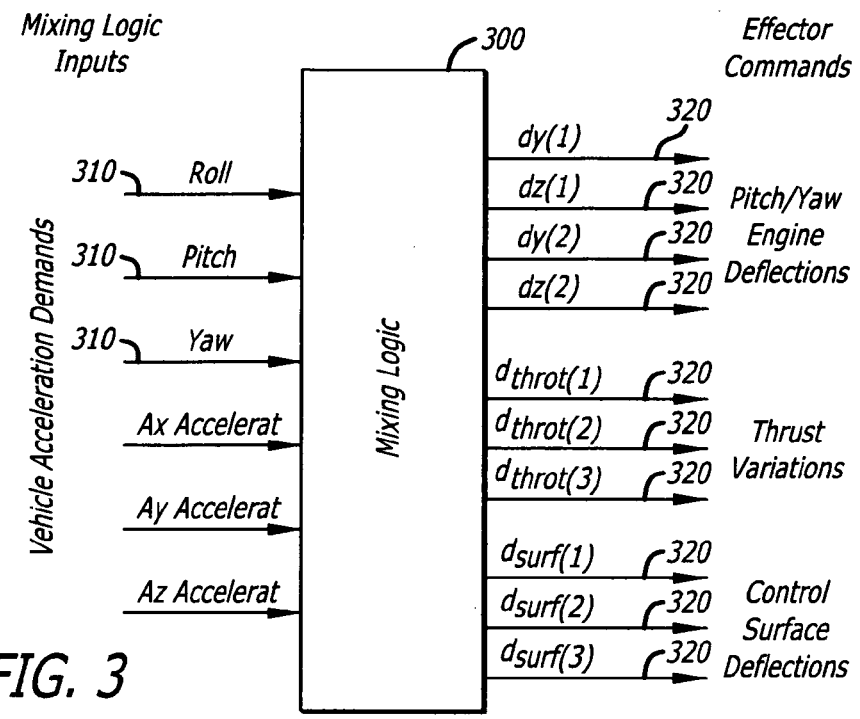
FIG. 3 is block diagram of inputs and outputs of a mixing logic utility of a flight vehicle modeling program according to one embodiment of the present invention.

The mixing logic 300 computes the mixing logic matrix and it saves it in the system file 120 as a gain matrix. For a vehicle system having three rotations and three translations accessible by effectors, the matrix has six columns, assuming of course that all six directions were selected in the appropriate menu. The six columns are the matrix inputs coming from the flight control acceleration demands. The first three correspond to the roll, pitch, and yaw angular acceleration demands, and the next three correspond to translational accelerations along x, y, and z as shown in FIG. 3. For a system with only three rotations and no translations the matrix has only three columns corresponding to the roll, pitch, and yaw demands. Fewer than three directions can also be selected. In the case, for example, when we are interested to control only the lateral directions after removing the pitch vehicle subsystem. A reduced combination of rotations and translations is also acceptable, such as, a pitch rotation in combination with x-axis and z-axis accelerations to be used for a reduced pitch vehicle model. Also for a lateral model one can choose the roll and yaw rotations together with the y-axis acceleration.

The number of rows in the mixing logic gain matrix is equal to the number of effector degrees of freedom. Starting with the pitch deflections of engine numbers: 1, 2, 3, ... n, followed by the yaw deflections of engine numbers: 1, 2, 3, ... n, followed by the engine deflections that gimbal in a single "constrained" direction ($\gamma i$), followed by the thrust variations of engines: 1, 2, 3, ... n, and finally with the deflections of control surfaces: 1, 2, 3, ... n. The definitions of the matrix inputs (control dofs) and matrix outputs (effectors) are also included below the matrix.

The matrix generated by the mixing logic 300 determines the pitch and yaw deflection angles of the TVC engines and control surfaces, or the variations in RCS thrust, and attempts to uncouple the vehicle motion, which means, attempting to provide angular accelerations in the directions demanded by the flight control system. FIG. 3 shows a typical flight control system using a mixing logic matrix. The mixing logic 300 converts the flight control system 500 output signals 310 to effector input signals 320 as shown in FIG. 5. Since it attempts to diagonalize the plant from the flight control system 500 output 310 to vehicle acceleration outputs, in the event of an engine or control surface failure, the mixing logic 300 must be reconfigured automatically during flight in order to avoid flight control instabilities, assuming, of course, that the vehicle has a sufficient number of effectors remaining to be able to control along the desired directions. The flight control system remains unaffected by the effector failure, only the mixing logic 300 changes.

Flight Vehicle Equations

The present invention performs mathematical equations of motion applicable to flight vehicles such as airplanes, gliders, launch vehicles, rockets, missiles, spacecraft, and other such vehicles capable of motion in air, space, or the atmosphere, and creates state-space systems at fixed conditions. These equations of motion model the dynamic behavior of these flight vehicles to describe how the vehicle will move in response to a combination of forces that are applied to the vehicle.

The equations are presented in two forms: the non-linear large angle equations suitable for 6-DOF time-domain simulations, and the linearized equations that describe small variations of a vehicle from its nominal trim position. The present invention uses the linear equations to create state-space systems for flight control analysis. The coefficients of the linearized equations are functions of the vehicle parameters such as mass properties, aerodynamics, trajectory data, slosh parameters, and structural modes at fixed times called "time-slices." The flight vehicle data is obtained from point mass trajectory simulations, fuel slosh models, wind tunnel data, mass properties, and finite element structural models (such as Nastran.)

Linear vehicle models are used to analyze the short period dynamic behavior of a vehicle in terms of stability, robustness against uncertainties, and system performance in response to commands and wind gusts disturbances. Launch vehicles are usually controlled by small deflections of the TVC engines ($\delta_e$) with respect to their nominal trim positions. Engine throttling is also used to control the vehicle by varying the engine thrust by an amount ($\pm\delta T_e$) from its nominal thrust ($T_e$). Entry vehicles, gliders, and aircraft are controlled by deflections of the control surfaces ($\pm\delta_{cs}$) from their nominal trim angle ($\Delta_{cs}$). The inputs to the dynamic model include control surface and engine deflections in (radians), thrust variations normalized by the nominal engine thrusts ($\delta T_e/T_e$), and wind gust velocity in (ft/sec). The direction of the wind gust is defined in the input data. The outputs include vehicle attitude, rate gyros, accelerations at the CG or at specific vehicle locations, angles of attack and sideslip ($\alpha$, $\beta$), and vane sensors which measure ($\alpha$, $\beta$) with flexibility at specific locations. The vehicle models are created in state-space form, which is a standard representation for applying singular value robustness analysis techniques, LQG, and H-infinity control design methods.

With the linear model, its state-variables describe only variations from their nominal values. They do capture, however, the dynamic behavior of the flight vehicle for relatively small dispersions from its trimmed flight condition, which is acceptable for flight control design, stability and performance analysis. The design assumption is that the vehicle remains fairly close to its target trajectory or trim condition and that the control system is able to provide a reasonable amount of robustness to uncertainties and the control authority to overcome small departures from the target trajectory due to gust disturbances. The coefficients of the vehicle equations are time varying and they are functions of the mass properties, aerodynamics, Mach number, alpha, and other parameters which are changing as the vehicle depletes fuel and changes speed and altitude along a trajectory. Control analysis, however, is based on linear models at fixed flight conditions, with constant coefficients. This assumption is generally acceptable when the variation of vehicle parameters occur at rates significantly lower than the time constants associated with the vehicle dynamics. The time-slice model is valid only for relatively short periods of time, (in the order of a few seconds), and the time constant associated with the rate of change of the coefficients is usually large in comparison with the time constants associated with the vehicle short period dynamics. The most common approach in flight control design is to derive control laws using linear models at fixed flight conditions and interpolate the control laws in between. The assumption is that, if the flight control system can provide an acceptable performance and robustness to uncertainties at many individual flight conditions along a trajectory this will obviously be a good indication that the vehicle can be successfully guided without deviating from the trajectory due to instability or due to its inability to respond to guidance signals. The linear model, however, is only useful for preliminary design and analysis. The final flight control system must also be evaluated using a detailed 6-DOF non-linear simulation.

The rigid-body equations used in this flight vehicle modeling program 100 comprise three rotational (roll, pitch and yaw), and three translational equations along x, y and z axes. The vehicle forces and moments generated in this model are computed with respect to the body axes system. The x axis is aligned along the fuselage reference line and its direction is positive along the velocity vector, the z axis is defined positive downward towards the floor, and the y axis right hand perpendicular to the x and z axes and positive towards the right wing. The Euler angles ($\phi$, $\theta$, $\psi$) define the vehicle attitude with respect to the inertial reference axes. In a launch vehicle the attitude reference is usually measured with respect to the launch pad with the Euler angles initially set at (0 degrees, 90 degrees, 0 degrees) respectively. Coupling between the pitch and lateral axes is also included in the equations of motion. This coupling can occur in several places due to lack of vehicle symmetry. For example, in the TVC, thrust mismatch, products of inertia, a non-symmetrical structure, or due to the presence of cross coupling terms in the aerodynamic coefficients, for example, Cm$\beta$, Cn$\alpha$, flying in a circle at a constant ($\beta$), etc. The x, y, z coordinates at various vehicle locations, such as: the engine gimbals, the control surface hinges, the IMU, gyros, accelerometers, CG, slosh masses, the moment reference center MRC, etc, are defined with respect to the vehicle reference axes. Sometimes the trajectory model, the mass properties, and the finite element model are defined in a different coordinate axes, units, and directions. The appropriate axes transformations and unit conversions in the mass properties, aero data, trajectory, and modal data is necessary when setting up the vehicle input data.

There are also situations where the analyst may have to post-process the vehicle quadruple model in order to remove some undesirable state variables from the model. For example, to extract a reduced order pitch or lateral model, or in a launch vehicle with a fixed thrust and at zero ($\alpha$), the change in velocity state ($\delta V$) along the velocity vector ($V_o$), and the acceleration output along the x axis are not useful and they can be removed because they are not controllable from the TVC input ($\delta_e$). It is a good practice to reduce the vehicle model by removing the non-contributing state-variables, specially when developing models for control synthesis, because most design algorithms require minimal state-space realizations. Note, that the state ($\delta V$) and the forward acceleration are important in regulating the speed of an aircraft or reentry gliders flying at high angles of attack, using speed-brake, variable thrust, or alpha control as means to regulate the speed. In these cases the ($\delta V$) variables are used in the control design and analysis. A large number of flexible modes can be used in the model to simulate the structural elasticity of the vehicle. Each bending mode is represented by a low damped second order equation that has a distinct natural frequency and a mode shape. Each bending equation behaves like a $2^{nd}$ order transfer function which relates the excitation forces and torques generated by the engines, the control surfaces, sloshing, and other disturbances, to the generalized modal displacements ($\eta_j$) of each mode (j). The actual bending displacement of the structure at a certain location is a combination of the generalized modal displacements from all the modes. In most applications 20 to 80 modes is sufficient to get an accurate representation of the structural flexibility. Sometimes as many as 400 modes may be included for flight verification. The coefficients of the bending equations are obtained from a finite elements program (FEM) such as Nastran. The aero-elastic coupling between the control surfaces and the vehicle modes can be implemented using two different approaches. The first approach is easy to implement but not very accurate and it requires modal shapes at the control surface hinges. It assumes that the structure is excited only by the aerodynamic forces and torques at the hinges generated by the deflections and accelerations of the control surfaces. The control surfaces are assumed to be rigid and they are coupled to the vehicle structure as separate bodies. The second method is more complex because in addition to the modal data it requires also GAFD (aero-elastic) data and inertial coupling coefficients or "h-parameters." It provides a more accurate representation of the dynamics involved because it attempts to capture the coupling between the vehicle structural flexibility and the aerodynamic forces and moments created by the vehicle motion ($\alpha$, $\beta$, p, q, r) and the control surface deflections. The GAFD approach captures also the effect of vehicle acceleration (including flexibility) on the control surface hinge moments. Both approaches require the following conditions: (a) the Nastran model must be "free-free," (b) the gimbaling engines and the slosh masses should not be included in the FEM model because they are coupled via the equations, (c) when the GAFD method is used to model the aero-surface/flex coupling, the control surfaces must be included in the FEM model and rigidly attached at the hinges. The surfaces are released in the equations via the h-parameters.

Tail-Wags-Dog and Hinge Moments

The "tail-wags-dog" (TWD) in launch vehicles engine gimbals, and at the hinges of the control surfaces of an aircraft, represent reaction forces and moments on the vehicle applied at the gimbals or hinges, which are created by the swiveling (accelerations) of the TVC engines or the control surfaces. The TWD introduces a complex pair of zeros in the transfer function "$\theta(s)/\delta(s)$." Assuming a sinusoidal swiveling of an aero-surface about its hinge, the TWD zero is at the frequency where the reaction forces due to the sinusoidal acceleration of the surface balance the aerodynamic forces at the hinge, or in the case of a TVC engine the reaction forces at the gimbal balance the small thrust component, $T*\sin(\delta)$, perpendicular to the thrusting direction, due to small deflections ($\delta$).

The "dog-wags-tail" (DWT), also known as load-torque feedback, is a loading torque at the TVC actuator created by the swiveling (accelerations) of the TVC engines. There is also the equivalent "hinge moments feedback" at the control surface actuators of an aircraft due to the aircraft acceleration. When the vehicle accelerates, mainly in the normal or lateral directions, as a result of aero or engine forces, the vehicle accelerations create an external loading torque in addition to the commanded actuator torque. The total torque applied to the engine or control surface is: (a) the steady-state trim torque due to the steady aero forces, (b) the torque due to the actuator deflection commanded ($\delta$), and (c) the external load-torque due to the vehicle acceleration. The modeling of tail-wags-dog and load-torque feedback requires an actuator model for every control surface hinge or engine gimbaling direction that is defined in the vehicle model. The actuator model has two inputs: a $\delta$-command and a load-torque input, and three outputs: engine deflection, engine rate and acceleration outputs. When the TWD/load-torque option is turned on, the vehicle model provides "load-torque" outputs for every engine direction and for every control surface. The load-torque feedback dynamics is in general considered to be a second order effect and it is only included in the final phase of the FCS analysis. Since the TWD and load-torque feedback dynamics require detailed actuator models for their implementation and since these effects can be removed from the model whenever necessary, when they are not used and the vehicle model no longer requires engine acceleration inputs, the actuator models can be simplified into simple transfer functions or unity gains. Otherwise, for the TWD/DWT implementation, a detailed actuator model is needed for every gimbaling direction (one for pitch and one for yaw engine deflection) and the vehicle model must have an engine acceleration input and a load-torque output for every gimbaling degree-of-freedom. The hinge moment and the tail-wag-dog equations for the control surfaces are similar to the load-torques and the tail-wag-dog equations for the TVC engines. The inputs to the vehicle model comprise surface deflection, rate, and acceleration for every aero-surface. An actuator model is used to drive each aero-surface. The same actuator models can be used to implement either TVC engines or control surfaces. The actuator outputs comprise surface deflections in (radians), rates, and angular accelerations in (rad/sec$^2$). Notice that when the TWD option is turned off, the engines and the control surface masses and moments of inertia must include the vehicle mass and moments of inertia, because when the TWD dynamics is turned on the effects of the engines and the control surfaces are captured by the force equations. The sensor dynamics are modeled as transfer functions. The vehicle, actuator, and sensor blocks are combined together to form the plant model by connecting the engine deflection and engine acceleration outputs from the actuator model to the corresponding vehicle model inputs, and by closing the load-torque feedback loop from the vehicle load-torque outputs to the corresponding actuator load-torque inputs.

Fuel Sloshing

Fuel motion inside the tanks is another potential source of instability mainly in launch vehicles because of the extremely low damping coefficients of liquid fuel inside the tanks, typically with ($\zeta$=0.0005) or less. The dynamic behavior of fuel sloshing inside the tanks is a therefore important issue in launch vehicles. The dynamics of the fuel is modeled using the spring mass analogy by a low damped second order transfer function that is excited by the vehicle acceleration at the tank. The oscillatory motion of a sloshing fuel mass creates disturbance forces that couple with other vehicle dynamics.

Being at low frequency and sometimes close to the control system bandwidth, the slosh resonances may degrade vehicle performance or even destabilize the vehicle. It is also possible for the slosh modes to interact with the bending modes and cause further deterioration in stability and limit cycles. The slosh parameters required to model fuel sloshing inside a tank are: the slosh mass ($m_s$), the slosh frequency ($\omega_s$) in (rad/sec), which is a function of the vehicle acceleration, the damping coefficient ($\zeta_s$), and the location ($x_s, y_s, z_s$) of the slosh mass with respect to the vehicle reference frame. The slosh parameters are usually obtained from experiments. Typical values of slosh masses in launch vehicles range between 100 to 5000 slugs.

The slosh frequencies range between 0.4 to 1 (Hz). The slosh frequency is proportional to the square root of the sensed vehicle acceleration. The program scales the frequency by multiplying it with the square root of the sensed acceleration. The slosh damping coefficients ($\zeta_s$) are usually very small, varying from 0.0002 for a tank without baffles to 0.002 for a tank with baffles. The slosh mass represents the moving part of the fuel and it is attached by a spring to a fictitious point at the centerline of the tank. The stiffness of the spring is adjusted to match the slosh frequency ($\omega_s$). The slosh mass in the spring mass analogy model has two translational degrees of freedom and generates normal and lateral forces on the vehicle (along the z and y axes). It is constrained to oscillate along a plane that is perpendicular to the acceleration vector. The slosh masses should not be included in the vehicle mass properties (mass, inertias, and cg calculations). Its effect on the vehicle is captured by the forces which are defined in the slosh equations.

The most commonly used propellants in launch vehicles are liquid oxygen, liquid hydrogen, peroxide, hydrazine, etc. Slosh frequencies are usually lower than bending mode frequencies but they are close to the rigid body bandwidth. They are usually phase-stabilizable, but sometimes they may require phase compensation to stabilize them. Fuel sloshing can be represented with spring mass or pendulum models that have very low damping. The most commonly used solution for dampening fuel sloshing is by mounting baffles in the interior of the tank. Sometimes the slosh oscillations can be damped out by introducing lead-lag compensators in the flight control loop but this may not be a robust solution. If the duration of the slosh instability, however, is relatively short or if the sloshing mass is small in comparison to the total vehicle mass, the instability can be ignored. When the slosh mass is relatively small it cannot shake up the vehicle very much. In general, fuel sloshing is an undesirable effect on the vehicle, not only in terms of potential instability and oscillations on the vehicle attitude but it can also cause other problems and hardware malfunctions. In a realistic sense the maximum amplitude of the slosh mass oscillations inside a tank is limited by the size of the tank. In fact the oscillations amplitude is smaller than the tank radius. Studies show that when the slosh mass amplitude reaches approximately ¾ of the tank radius the fuel wave brakes splashing the liquid inside the tank and the oscillations start building up again from low amplitudes. The spring mass linear model is acceptable for linear stability analysis, but it is inaccurate for larger slosh mass deflections and too conservative for time domain simulations because it does not bound the slosh mass deflections like the pendulum model does. When slosh instabilities occur, engineering intuition is needed to determine the severity of the problem. The answer usually lies in the maximum amount of vehicle disturbance that can be tolerated by the slosh instability. The sloshing problem becomes even more complex when it couples with flexibility. The equations in the flight vehicle modeling program 100 include also slosh-flex coupling terms which describe and predict how the sloshing of fuel in the rocket's fuel tank will cause the rocket's structure to vibrate or throw the rocket off-course.

Matlab® Utilities

The present invention provides two utility functions, one that exports data to Matlab® and one that reads data from Matlab® files. The Matlab® exporting utility reads matrices or state-space systems from a systems file and converts them into Matlab® "ASCII" matrices (.mat) or m-file functions (.m). The Matlab® reading utility reads Matlab® "ASCII" matrices (*.mat) and saves them in a system file 120, either as a state-space system or as individual matrices other than [A,B,C,D]. The user 150 can specify two separate project directories, one for the data files used by the Flixan modeling project, and a separate directory for the Matlab® project containing the Simulink® files (*.mdl), m-files (*.m), and Matlab® matrices (*.mat). The Matlab® transfer utilities can be selected from the flight vehicle modeling program 100 main menu.

After selecting the project directory, the user 150 selects to export the file to Matlab® from the file menu and a systems file from that folder that contains the data to be exported into Matlab®. The program also requires from the user 150 to select the Matlab® destination directory. The user 150 can select between three different types of data sets from a system file 120 to be transferred to Matlab®: a single gain matrix (other than A, B, C, D), a state-space system [A, B, C, D], and a synthesis model for H-infinity control design comprising the nine matrices [A, B1, B2, C1, C2, D11, D12, D21, D22]. An options menu appears where the user 150 can select the type of data to be transferred from the system file 120, and in what file type format they will appear in the Matlab® folder. If the input data is a single matrix, it will be converted into a Matlab® type (*.mat) ASCII file. The matrix to be transferred is selected from a menu that lists all the individual matrices, other than (A, B, C, D), that have been saved in the system file 120. If the input data is a state-space system the utility reads the four system matrices and the system title from the system file. The exported data in the Matlab® folder can be saved either as individual matrices (A.mat, B.mat, C.mat, D.mat) or as a system function (m-file). The user 150 specifies the desired format, and the state system to be transferred can be selected from a menu that lists all the individual system titles which are saved in the selected system file. When the system is saved as a Matlab® function the program requires a function name and saves the data as a function in a single m-file in the Matlab® directory. For a control synthesis state-space model, the transferring process is similar to the quadruple state-space model except that there are nine matrices being exported instead of four. In the case of a function the m-file contains the nine matrices.

Matrix files created by Matlab® can also be exported to the flight vehicle modeling program 100. The systems or individual matrices exported from Matlab® are ASCII (*.mat) files. The user 150 has the option of saving the .mat file as a single file, or in 4 separate [A,B,C,D] files. In the case of a system, the four a, b, c, d matrices from the Matlab® workspace can also be exported as a single file containing the four matrices with an additional line on the top. The first line is a single row vector with four elements containing the system dimension (number of inputs, states, and outputs) and the sampling frequency in case of a non-continuous system being described in the z-domain by state difference equations. In the case of a continuous system the sampling period is set to zero.

Matlab® data can also be separated imported into the flight vehicle modeling program 100, if the user 150 wants to import an individual matrix (other than A,B,C,D) or state-space system. From the main file menu the user 150 specifies the Matlab® project directory that contains the Matlab® matrix files. The user 150 selects the appropriate matrix files from the Matlab® folder. The same menu is used to select among the (*.mat) files whether the system is defined by four separate matrix files or by a single file. The utility reads the individual matrix or state system data and it saves it in the system file 120, either as a separate gain matrix or as a state-space system (A, B, C, D), or as a synthesis model.

It is to be understood that other embodiments may be utilized and structural and functional changes may be made without departing from the scope of the present invention. The foregoing descriptions of embodiments of the invention have been presented for the purposes of illustration and description. It is not intended to be exhaustive or to limit the invention to the precise forms disclosed. Accordingly, many modifications and variations are possible in light of the above teachings. It is therefore intended that the scope of the invention be limited not by this detailed description.

The invention claimed is:

1. A method of modeling dynamic characteristics of a flight vehicle, comprising:
    collecting input data specifying flight vehicle parameters at a steady-state condition for modeling variables of flight vehicle response to dynamic forces during steady-state operation of the flight vehicle, the input data including modal input data specifying one or more structural flexibility modes, wherein the one or more structural flexibility modes includes a set of bending modes, each bending mode defined by parameters specifying bending displacement of the flight vehicle at key nodes in the flight vehicle, the parameters defining each bending mode include at least one of a mode frequency, a damping coefficient, a generalized mass, and a generalized mode shape at the key nodes in the flight vehicle, the key nodes including force application points and sensors;
    converting the input data into state-space systems data for use by at least one utility pro-gram module to create a state-space system modeling one or more components of flight vehicle activity, the at least one utility program module generating a systems data output file comprising at least one matrix mapping the input data to the state-space systems data; and
    generating an output file for simulating flight vehicle design and performance based on at least one matrix mapping the input data to the state-space systems data.

2. The method of claim 1, wherein the input data corresponds to the at least one utility program module, the at least one utility program module configured to analyze flight vehicle response to a particular dynamic force.

3. The method of claim 2, wherein the at least one utility program module generates a systems data file for populating the at least one matrix.

4. The method of claim 1, wherein the collecting input data specifying flight vehicle parameters at a steady-state condition further comprises collecting data specifying at least one of mass properties, trajectory, sensors, aerodynamic derivates, engine data, control surface data, slosh parameters, and wind gust.

5. The method of claim 4, wherein the sensors include at least one of a gyro sensor, an accelerometer, and a vane sensor.

6. The method of claim 1, further comprising modifying the system data output file to de-couple state-space systems in the system data output file to separate a flight vehicle model into separate systems.

7. The method of claim 3, wherein the at least one utility program module includes a module for modifying the systems data output file.

8. The method of claim 1, wherein collecting input data further comprises collecting actuator data defining variables acting on surfaces controlling movement of the flight vehicle.

9. The method of claim 8, wherein the actuator data includes data specifying engine thrust vector control conditions and control surface slewing conditions.

10. The method of claim 9, further comprising combining the actuator data with the input data defining flight vehicle parameters to model engine thrust vector control conditions and control surface slewing conditions in the at least one matrix.

11. The method of claim 1, wherein collecting input data further comprises collecting effector data defining engine parameters and control surface aero coefficients.

12. The method of claim 11, further comprising combining the effector data with the input data to create an effector mixing logic matrix within the at least one matrix modeling the engine parameters and control surface aero coefficients acting on the flight vehicle.

13. The method of claim 12, wherein the effector data decouples rigid body dynamics acting on the flight vehicle by reducing interaction in at least one direction.

14. The method of claim 13, wherein the reducing interaction in at least one direction includes roll, pitch, and yaw directions.

15. The method of claim 8, wherein collecting input data further comprises collecting tail-wags-dog data.

16. The method of claim 15, further comprising combining the tail- wags-dog data with the input data defining flight vehicle parameters to model reaction forces and moments on the flight vehicle at engine gimbals and control surface hinges in the at least one matrix.

17. The method of claim 1, wherein collecting input data further comprises collecting fuel sloshing data.

18. The method of claim 17, further comprising combining the fuel sloshing data with the input data defining flight vehicle parameters to model dynamic behavior of fuel motion inside a flight vehicle in the at least one matrix.

19. The method of claim 1, further comprising collecting aero- elastic data defining effects of aerodynamic forces on structural flexibility of a flight vehicle.

20. The method of claim 19, wherein the aero-elastic data includes a first set of coefficients describing an effect of modal displacements and modal rates on flight vehicle aerodynamic forces and moments, a second set of coefficients describing excitement of modal displacement caused by effects of vehicle motion, and a third set of coefficients describing the effect of changes in vehicle motion on moments at hinges of control surfaces.

21. The method of claim 20, further comprising combining the aero-elastic data with the input data and modeling aero-elastic effects on a flight vehicle to generate aero-elastic models in the at least one program module.

22. The method of claim 1, further comprising compiling the input data into an input data file and managing the input data file with a utility program module.

23. The method of claim 1, wherein the flight vehicle is an aircraft.

24. The method of claim 1, wherein the flight vehicle is a launch vehicle.

25. The method of claim 1, wherein the flight vehicle is a flexible structure capable of inter-facing with a flight vehicle.

26. The method of claim 25, wherein the flexible structure is a space station.

27. A method of modeling dynamic characteristics of a flight vehicle, comprising:
compiling an input data file from input data defining a flight vehicle;
collecting effector data defining engine parameters and control surface aero coefficients, wherein the effector data decouples rigid body dynamics acting on the flight vehicle by reducing interaction in at least one direction that includes roll, pitch, and yaw directions;
combining the effector data with the input data to create an effector mixing logic matrix within the at least one matrix modeling the engine parameters and control surface aero coefficients acting on the flight vehicle;
executing the input data file to convert the input data defining a flight vehicle and the effector data into a state-space system file comprising data defining at least one system;
extracting the data defining at least one system from the state-space system file; and
exporting the data defining the at least one system to a file format for simulating performance of the flight vehicle.

28. The method of claim 27, further comprising collecting the input data defining a flight vehicle, the input data including steady-state vehicle parameters at a fixed flight condition.

29. The method of claim 28, wherein the input data defining a flight vehicle is collected via a plurality of pull-down menus in a graphical user interface.

30. The method of claim 28, wherein the collecting the input data defining a flight vehicle further comprises collecting model input data defining one or more structural flexibility modes.

31. The method of claim 30, wherein the collecting the input data defining a flight vehicle further comprises collecting aero-elastic input data defining effects of aerodynamic forces on structural flexibility of a flight vehicle.

32. The method of claim 31, further comprising combining the input data including steady state vehicle parameters at a fixed flight condition with modal input data defining one or more structural flexibility modes and input data specifying aero-elastic input data defining effects of aerodynamic forces on structural flexibility of a flight vehicle.

33. The method of claim 28, wherein the collecting input data including steady-state vehicle parameters at a fixed flight condition further comprises collecting data specifying at least one of mass properties, trajectory, sensors, aerodynamic derivates, engine data, control surface data, slosh parameters, and wind gust.

34. The method of claim 33, wherein the sensors include at least one of a gyro sensor, an accelerometer, and a vane sensor.

35. The method of claim 28, wherein the collecting input data further comprises collecting actuator input data specifying variables acting on surfaces controlling movement of the flight vehicle.

36. The method of claim 28, wherein the collecting input data further comprises collecting vibration data specifying variables for reactionary forces and resonance during operation of the flight vehicle.

37. The method of claim 28, wherein collecting input data further comprises collecting tail-wags-dog data.

38. The method of claim 37, further comprising combining the tail-wags-dog data with the input data defining a flight vehicle to model reaction forces and moments on the flight vehicle at engine gimbals and control surface hinges in the at least one matrix.

39. The method of claim 38, wherein collecting input data further comprises collecting fuel sloshing data.

40. The method of claim 39, further comprising combining the fuel sloshing data with the input data defining a flight vehicle to model dynamic behavior of fuel motion inside a flight vehicle in the at least one matrix.

41. The method of claim 28, wherein the input data file includes multiple sets of vehicle data.

42. The method of clam 28, wherein the state-space system file includes state-space systems data generated by at least one utility program module modeling one or more components of flight vehicle activity, the state-space systems file comprising at least one matrix mapping the input data to the state-space systems data.

43. A method of modeling dynamic characteristics of a flight vehicle, comprising:
collecting input data specifying flight vehicle parameters at a steady-state condition for modeling variables of flight vehicle response to dynamic forces during steady-state operation of the flight vehicle;
collecting effector data defining engine parameters and control surface aero coefficients, wherein the effector data decouples rigid body dynamics acting on the flight vehicle by reducing interaction in at least one direction that includes roll, pitch, and yaw directions;
combining the effector data with the input data to create an effector mixing logic matrix within the at least one matrix modeling the engine parameters and control surface aero coefficients acting on the flight vehicle;
converting the combined input data and effector data into state-space systems data for use by at least one utility program module to create a state-space system modeling one or more components of flight vehicle activity, the at least one utility program module generating a systems data output file comprising at least one matrix mapping the combined input data and effector data to the state-space systems data; and
generating an output file for simulating flight vehicle design and performance based on at least one matrix mapping the combined input data and effector data to the state-space systems data.

44. The method of claim 43, further comprising collecting modal input data including data specifying one or more structural flexibility modes.

45. The method of claim 44, wherein the one or more structural flexibility modes includes a set of bending modes, each bending mode defined by parameters specifying bending displacement of the flight vehicle at key nodes in the flight vehicle.

46. The method of claim 45, wherein the parameters defining each bending mode include at least one of a mode frequency, a damping coefficient, a generalized mass, and a generalized mode shape at the keys in the flight vehicle, the key nodes including force application points and sensors.

47. The method of claim 43, wherein the collecting input data specifying flight vehicle parameters at a steady-state condition further comprises collecting data specifying at least one of mass properties, trajectory, sensors, aerodynamic derivates, engine data, control surface data, slosh parameters, and wind gust.

48. The method of claim 47, wherein the sensors including at least one of a gyro sensor, an accelerometer, and a vane sensor.

49. The method of claim 43, further comprising modifying the system data output file to de-couple state-space systems in the system data output file to separate a flight vehicle model into separate systems.

50. The method of claim 43, wherein collecting input data further comprises collecting actuator data defining variables acting on surfaces controlling movement of the flight vehicle.

51. The method of claim 50, wherein the actuator data includes data specifying engine thrust vector control conditions and control surface slewing conditions.

52. The method of claim 51, further comprising combining the actuator data with the input data defining flight vehicle parameters to model engine thrust vector control conditions and control surface slewing conditions in the at least one matrix.

53. The method of claim 43, wherein collecting input data further comprises collecting tail-wags-dog data.

54. The method of claim 53, further comprising combining the tail-wags-dog data with the input data defining flight vehicle parameters to model reaction forces and moments on the flight vehicle at engine gimbals and control surface hinges in the at least one matrix.

55. The method of claim 43, wherein collecting input data further comprises collecting fuel sloshing data.

56. The method of claim 55, further comprising combining the fuel sloshing data with the input data defining flight vehicle parameters to model dynamic behavior of fuel motion inside a flight vehicle in the at least one matrix.

57. The method of claim 43, further comprising collecting aero-elastic data defining effects of aerodynamic forces on structural flexibility of a flight vehicle.

58. The method of claim 57, wherein the aero-elastic data includes a first set of coefficients describing an effect of modal displacements and modal rates on flight vehicle aerodynamic forces and moments, a second set of coefficients describing excitement of modal displacement caused by effects of vehicle motion, and a third set of coefficients describing the effect of changes in vehicle motion on moments at hinges of control surfaces.

* * * * *